(12) United States Patent
Imamura et al.

(10) Patent No.: US 12,308,350 B2
(45) Date of Patent: May 20, 2025

(54) SEMICONDUCTOR DEVICE

(71) Applicant: Nuvoton Technology Corporation Japan, Kyoto (JP)

(72) Inventors: Takeshi Imamura, Kyoto (JP); Masaaki Hirako, Shiga (JP); Takashi Ohashi, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/923,340

(22) Filed: Oct. 22, 2024

(65) Prior Publication Data
US 2025/0046759 A1 Feb. 6, 2025

Related U.S. Application Data

(63) Continuation of application No. PCT/JP2024/000300, filed on Jan. 10, 2024.
(Continued)

(51) Int. Cl.
| | |
|---|---|
| *H10D 62/10* | (2025.01) |
| *H01L 23/00* | (2006.01) |
| *H01L 25/07* | (2006.01) |
| *H10D 30/66* | (2025.01) |
| *H10D 64/23* | (2025.01) |

(52) U.S. Cl.
CPC .......... *H01L 25/072* (2013.01); *H01L 24/29* (2013.01); *H01L 24/32* (2013.01); *H10D 30/668* (2025.01);
(Continued)

(58) Field of Classification Search
CPC ...... H10D 30/63; H10D 30/668; H10D 84/83; H10D 64/252; H01L 25/072; H01L 2924/13091; H01L 2924/3511
See application file for complete search history.

(56) References Cited

U.S. PATENT DOCUMENTS

| | | | |
|---|---|---|---|
| 4,616,413 A | 10/1986 | Iliou et al. | |
| 5,288,653 A * | 2/1994 | Enjoh | H10D 30/0291 257/E21.418 |

(Continued)

FOREIGN PATENT DOCUMENTS

| | | |
|---|---|---|
| CN | 113035865 A | 6/2021 |
| JP | 2020-043164 A | 3/2020 |
| WO | 2018/123799 A1 | 7/2018 |

OTHER PUBLICATIONS

Decision to Grant a Patent dated Nov. 19, 2024 issued in the corresponding Japanese Patent Application No. 2024-560409, with English translation.
(Continued)

*Primary Examiner* — Khiem D Nguyen
(74) *Attorney, Agent, or Firm* — Rimon P.C.

(57) ABSTRACT

A semiconductor device includes: a semiconductor layer; first and second vertical MOS transistors provided in the semiconductor layer; a metal layer in contact with and connected to an entire back face of the semiconductor layer; and a support bonded to the back face side of the metal layer via a conductive adhesive. In a plan view, the support is larger in area than the semiconductor layer and encompasses the semiconductor layer. A thickness of the support is greater than a thickness of the semiconductor layer. In a cross-sectional view of the semiconductor device including a center of the semiconductor layer and an outer periphery of the semiconductor layer in the plan view, a semiconductor chip resulting from excluding the support and the conductive adhesive from the semiconductor device is in a curved shape projecting in a direction away from the support.

13 Claims, 17 Drawing Sheets

Related U.S. Application Data

(60) Provisional application No. 63/440,617, filed on Jan. 23, 2023.

(52) U.S. Cl.
CPC ......... *H10D 62/117* (2025.01); *H10D 62/126* (2025.01); *H10D 64/252* (2025.01); *H01L 2224/2919* (2013.01); *H01L 2224/32058* (2013.01); *H01L 2224/32137* (2013.01); *H01L 2224/32225* (2013.01); *H01L 2924/13091* (2013.01); *H01L 2924/3511* (2013.01)

(56) References Cited

U.S. PATENT DOCUMENTS

| | | | | |
|---|---|---|---|---|
| 11,069,783 B2* | 7/2021 | Yasuda | .................... | H01L 25/07 |
| 2012/0049290 A1* | 3/2012 | Shiraishi | ............... | H02M 7/003 |
| | | | | 257/369 |
| 2019/0319126 A1* | 10/2019 | Matsushima | ....... | H01L 23/3114 |
| 2020/0083367 A1 | 3/2020 | Kojima | | |
| 2020/0105723 A1* | 4/2020 | Hagiwara | ............. | H01L 21/565 |
| 2020/0395479 A1 | 12/2020 | Fujioka et al. | | |
| 2021/0104629 A1 | 4/2021 | Fujioka et al. | | |
| 2022/0310539 A1* | 9/2022 | Takada | ................. | H10D 64/252 |

OTHER PUBLICATIONS

International Search Report dated Apr. 2, 2024 issued in International Patent Application No. PCT/JP2024/000300, with English translation.

International Search Report dated Apr. 2, 2024 issued in International Patent Application No. PCT/JP2024/000297, with English translation.

Office Action and Search Report mailed Apr. 3, 2025 for the corresponding Chinese patent application No. 202480002316.6, w/English Translation of the Search Report.

* cited by examiner

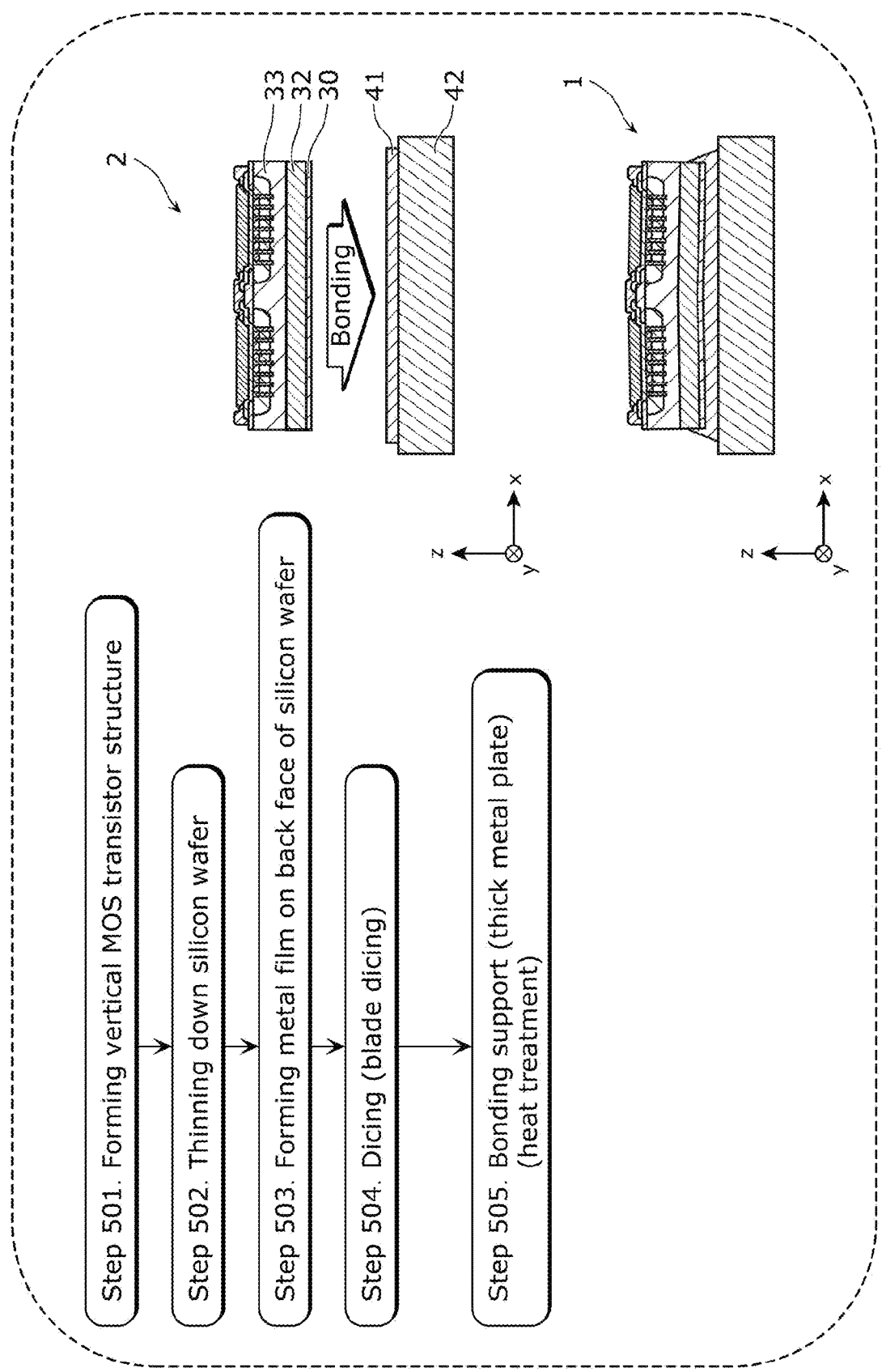

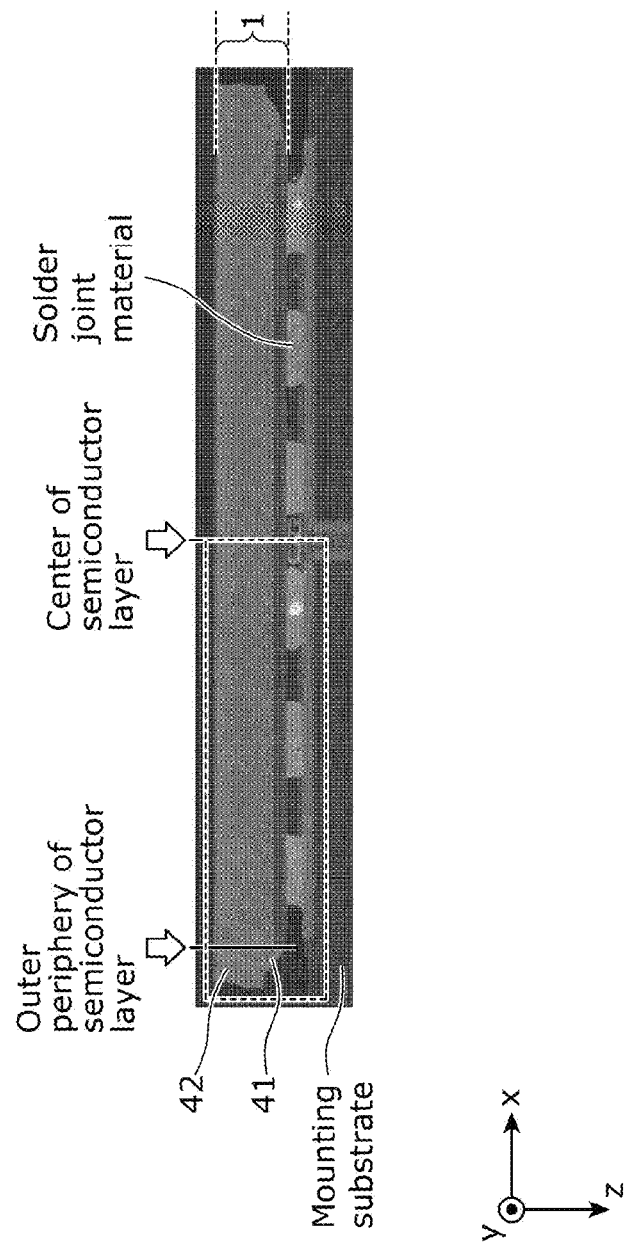

SEMICONDUCTOR DEVICE

CROSS REFERENCE TO RELATED APPLICATIONS

This is a continuation application of PCT International Application No. PCT/JP2024/000300 filed on Jan. 10, 2024, designating the United States of America, which is based on and claims priority of U.S. Patent Application No. 63/440,617 filed on Jan. 23, 2023. The entire disclosures of the above-identified applications, including the specifications, drawings and claims are incorporated herein by reference in their entirety.

FIELD

The present disclosure relates to a semiconductor device.

BACKGROUND

A vertical metal-oxide semiconductor (MOS) transistor in a dual configuration that is capable of controlling bidirectional conduction using one chip has been used for the purpose of protecting a lithium-ion battery from at least one of overcharge or overdischarge.

CITATION LIST

Patent Literature

PTL 1: U.S. Pat. No. 4,616,413

SUMMARY

Technical Problem

In order to reduce the on resistance of a vertical MOS transistor in a dual configuration (hereinafter also referred to as a "semiconductor chip"), the vertical MOS transistor in the dual configuration may include a structure that has a large area in a plan view and in which a semiconductor substrate is thin. However, such a structure causes a warp of the semiconductor chip to increase, and the strength of the semiconductor chip to decrease. Patent Literature (PTL) 1 discloses a structure in which a printed circuit board is bonded to a rigid metal plate via a conductive adhesive.

In view of the above, the present disclosure has an object to provide a semiconductor device that includes a vertical MOS transistor in a dual configuration that is capable of improving a degree of adhesion in a structure in which a rigid metal plate is bonded via a conductive adhesive.

Solution to Problem

In order to solve the above problem, a semiconductor device according to the present disclosure is a semiconductor device that is a facedown mountable semiconductor device, the semiconductor device comprising: a semiconductor substrate; a low-concentration impurity layer that is provided on a front face side of the semiconductor substrate; a first vertical metal-oxide semiconductor (MOS) transistor that is provided in a first region of a semiconductor layer that is a combination of the semiconductor substrate and the low-concentration impurity layer; a second vertical MOS transistor that is provided in a second region adjacent to the first region in a plan view of the semiconductor layer; a first source electrode of the first vertical MOS transistor, the first source electrode being provided on a front face side of the semiconductor layer; a second source electrode of the second vertical MOS transistor, the second source electrode being provided on the front face side of the semiconductor layer; and a support that is provided on a back face side of the semiconductor substrate via a conductive adhesive, wherein in the plan view, the support is larger in area than the semiconductor layer and encompasses the semiconductor layer, a thickness of the support is greater than a thickness of the semiconductor layer, and when a semiconductor chip of the semiconductor device excluding the support and the conductive adhesive is seen in a cross-sectional view of the semiconductor device that includes a center of the semiconductor layer and an outer periphery of the semiconductor layer in the plan view, the semiconductor chip is in a curved shape that projects in a direction away from the support.

The above configuration allows a vertical MOS transistor in a dual configuration to mitigate a warp of a semiconductor chip while reducing on resistance, and increase the strength of the semiconductor chip.

Advantageous Effects

The present disclosure has an object to provide a semiconductor device that includes a vertical MOS transistor in a dual configuration that mitigates a warp of a semiconductor chip while reducing the on resistance of the semiconductor chip, and further increases the strength of the semiconductor chip.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 4A is a flow chart illustrating parts of a manufacturing process for the semiconductor device according to Embodiment 1.

FIG. 7A is a cross-sectional SEM image showing an example of a structure of the semiconductor device according to Embodiment 1.

DESCRIPTION OF EMBODIMENTS

Hereinafter, specific examples of a semiconductor device according to one aspect of the present disclosure are described with reference to the drawings. Each of the embodiments described below shows a specific example of the present disclosure. Therefore, numerical values, shapes, constituent elements, and the arrangement and connection of the constituent elements shown in the embodiments below are mere examples, and are not intended to limit the scope of the present disclosure. Moreover, the respective figures are schematic diagrams and are not necessarily precise illustrations. In the respective figures, substantially identical constituent elements are given the same reference signs, and overlapping descriptions are omitted or simplified.

Embodiment 1

[1. Structure of Semiconductor Device]

Figure 1:
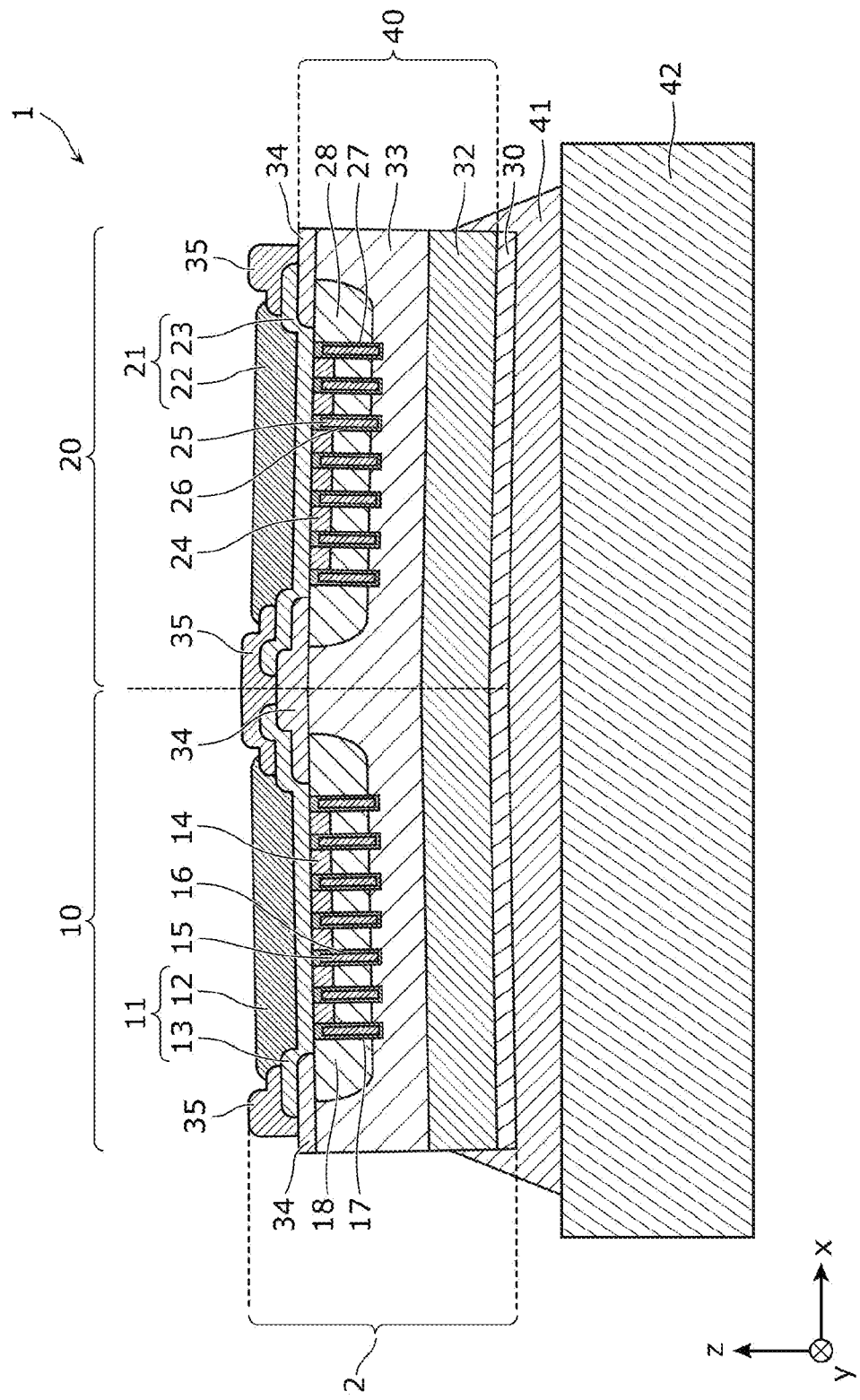
FIG. 1 is a schematic cross-sectional view illustrating an example of a structure of a semiconductor device according to Embodiment 1.
Figure 2A:
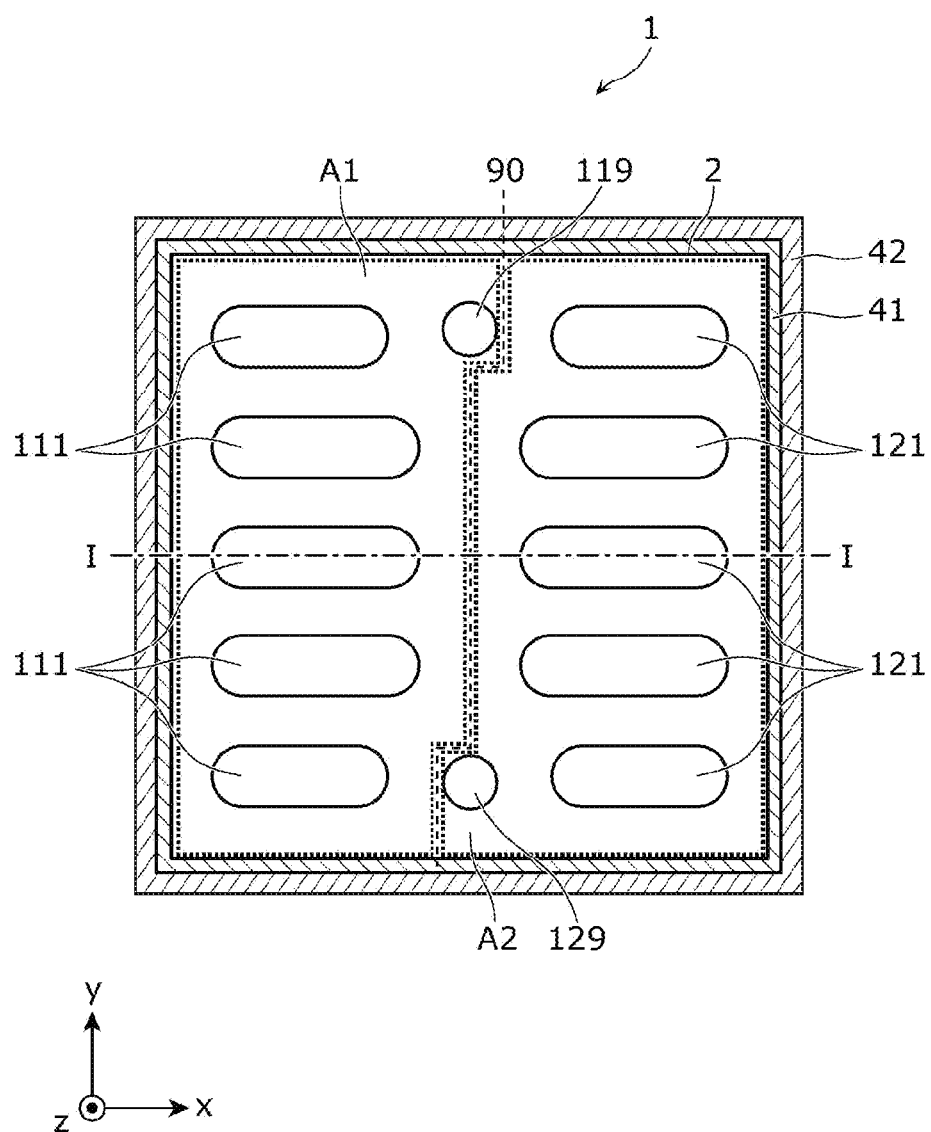
FIG. 2A is a schematic plan view illustrating the example of the structure of the semiconductor device according to Embodiment 1.
Figure 2B:
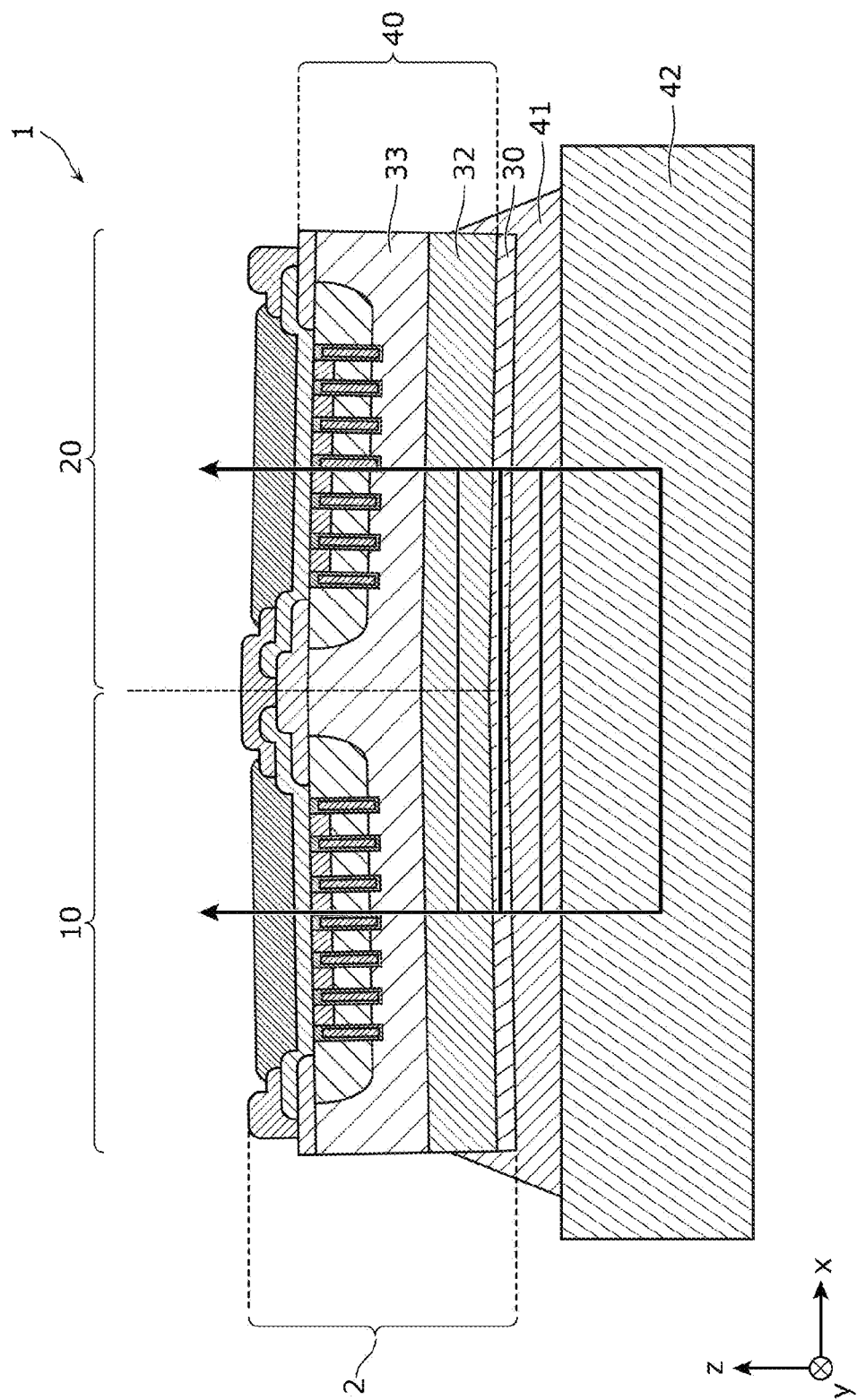
FIG. 2B is a schematic cross-sectional view illustrating a principal current flowing through the semiconductor device according to Embodiment 1.

FIG. 1 is a schematic cross-sectional view illustrating an example of a structure of a semiconductor device. FIG. 2A is a plan view of the structure. The size and shape of the semiconductor device are an example, except that the semiconductor device is in a rectangular shape (a square or a rectangle). Moreover, the size, shape, and arrangement of pads are also an example. FIG. 2B is a cross-sectional view schematically illustrating a principal current flowing through the semiconductor device. FIG. 1 and FIG. 2B are a cross section taken along line I-I shown in FIG. 2A.

In the present disclosure, although the following description is based on the assumption that semiconductor device 1 includes metal layer 30, semiconductor device 1 is not necessarily limited to a configuration that includes metal layer 30.

As shown in FIG. 1 and FIG. 2B, semiconductor device 1 includes semiconductor substrate 32, metal layer 30, and low-concentration impurity layer 33 provided on semiconductor substrate 32. In the present disclosure, a combination of semiconductor substrate 32 and low-concentration impurity layer 33 is referred to as semiconductor layer 40.

Semiconductor substrate 32 is disposed on a back face side of semiconductor layer 40 and comprises silicon of a first conductivity type that contains impurities of the first conductivity type. Low-concentration impurity layer 33 is disposed on a front face side of semiconductor layer 40, is provided in contact with semiconductor substrate 32, contains impurities of the first conductivity type that have a concentration lower than the concentration of the impurities of the first conductivity type of semiconductor substrate 32, and is of the first conductivity type. Low-concentration impurity layer 33 may be provided on semiconductor substrate 32 by, for example, epitaxial growth.

As shown in FIG. 1 and FIG. 2A, semiconductor device 1 includes: first vertical metal-oxide semiconductor (MOS) transistor 10 (hereinafter also referred to as "transistor 10") provided in first region A1 in semiconductor layer 40; and second vertical MOS transistor 20 (hereinafter also referred to as "transistor 20") provided in second region A2 in semiconductor layer 40.

Here, as shown in FIG. 2A, first region A1 and second region A2 are adjacent to each other in a plan view of semiconductor layer 40, and divide semiconductor layer 40 into equal areas. In FIG. 2A, a dashed line indicates virtual boundary line 90 between first region A1 and second region A2. (For the sake of clarity, the dashed line indicating boundary line 90 extends to the outside of semiconductor layer 40 and semiconductor device 1.) It should be noted that, in FIG. 2A, although the dashed line indicating first region A1 and second region A2 is not caused to coincide strictly with semiconductor layer 40 and boundary line 90 for the sake of clarity, and is indicated inside with a slight space left, the outer periphery of first region A1 and the outer periphery of second region A2 substantially coincide with the outer periphery of semiconductor layer 40 and boundary line 90.

Metal layer 30 is provided on the back face side of semiconductor layer 40 (semiconductor substrate 32) and comprises, for example, silver (Ag) or copper (Cu). It should be noted that metal layer 30 may include a trace amount of a chemical element other than metal mixed in as impurities in a manufacturing process for a metal material. Moreover, it makes no difference whether metal layer 30 is provided on an entire back face of semiconductor layer 40 (semiconductor substrate 32). Metal layer 30 may have a thickness of at most 10 [μm], and more specifically may have a thickness of at most 5 [μm]. Metal layer 30 has a thickness of, for example, 3 [μm].

Support 42 is provided in indirect contact with a back face side of metal layer 30 via conductive adhesive 41. Support 42 typically has a thickness at least twice as much as the thickness of semiconductor layer 40, and is, for example, a flat metal plate that has a uniform in-plane thickness of 200 [μm]. Hereinafter, support 42 may be referred to as thick metal plate 42. Thick metal plate 42 comprises a metal material that mainly includes, for example, copper (Cu). In addition, conductive adhesive 41 is typically silver paste.

As shown in FIG. 1, in the present disclosure, a structure obtained by excluding support 42 and conductive adhesive 41 from semiconductor device 1 is referred to as semiconductor chip 2. As shown in FIG. 1, semiconductor chip 2 is in a curved shape that projects in a direction away from support 42. The curved shape refers to, for example, a shape formed due to a warp. The amount of a warp of semiconductor chip 2 is a difference between the highest position and the lowest position in the Z direction in a top face or a bottom face of semiconductor layer 40 or in a bottom face of metal layer 30, in a cross-sectional view of semiconductor chip 2. When a warp that occurs in semiconductor chip 2 is a warp that projects in the direction away from support 42, the highest position is the center of semiconductor layer 40 in the plan view, and the lowest position is the outer periphery of semiconductor layer 40, especially the corner portions of semiconductor layer 40, in the plan view.

It should be noted that the center of semiconductor layer 40 in the plan view refers to an intersection point of the diagonal lines of semiconductor layer 40 in the plan view. Moreover, a cross-sectional view of semiconductor device 1 in the present disclosure refers to when a cross section of semiconductor device 1 is seen along a plane including the center of semiconductor layer 40 in semiconductor chip 2 in the plan view and the outer periphery of semiconductor layer 40 in semiconductor chip 2 in the plan view. Here, the outer periphery of semiconductor layer 40 may be any position in the outer periphery of semiconductor layer 40.

As shown in FIG. 1 and FIG. 2A, first body region 18 that contains impurities of a second conductivity type different form the first conductivity type is provided in first region A1 of semiconductor layer 40 (low-concentration impurity layer 33). First source region 14 that contains impurities of the first conductivity type, first gate conductor 15, and first gate insulating film 16 are provided in first body region 18.

First gate insulating film 16 is provided inside each of a plurality of first gate trenches 17 that penetrate through first source region 14 and first body region 18 from the top face of semiconductor layer 40 to a depth that reaches a portion of low-concentration impurity layer 33. First gate conductor 15 is provided on first gate insulating film 16 inside each of the plurality of first gate trenches 17. First gate conductor 15 is an embedded gate electrode that is embedded inside semiconductor layer 40, and is electrically connected to first gate pad 119.

First source electrode 11 includes portion 12 and portion 13. Portion 12 is connected to first source region 14 and first body region 18 via portion 13. Portion 12 of first source electrode 11 is a layer joined with solder at the time of reflow in facedown mounting, and may comprise, as a non-limiting example, a metal material including at least one of nickel, titanium, tungsten, or palladium. The surface of portion 12 may be plated with gold etc.

Portion 13 of first source electrode 11 is a layer that connects portion 12 and semiconductor layer 40, and may comprise, as a non-limiting example, a metal material including at least one of aluminum, copper, gold, or silver.

A thickness of first source electrode 11, including the total thickness of portion 12 and portion 13 is, for example, at least 2 [μm] and at most 13 [μm].

Second body region 28 that contains impurities of the second conductivity type is provided in second region A2 of low-concentration impurity layer 33. Second source region 24 that contains impurities of the first conductivity type, second gate conductor 25, and second gate insulating film 26 are provided in second body region 28.

Second gate insulating film 26 is provided inside each of a plurality of second gate trenches 27 that penetrate through second source region 24 and second body region 28 from the top face of semiconductor layer 40 to a depth that reaches a portion of low-concentration impurity layer 33. Second gate conductor 25 is provided on second gate insulating film 26 inside each of the plurality of second gate trenches 27. Second gate conductor 25 is an embedded gate electrode that is embedded inside semiconductor layer 40, and is electrically connected to second gate pad 129.

Second source electrode 21 includes portion 22 and portion 23. Portion 22 is connected to second source region 24 and second body region 28 via portion 23. Portion 22 of second source electrode 21 is a layer joined with solder at the time of reflow in facedown mounting, and may comprise, as a non-limiting example, a metal material including at least one of nickel, titanium, tungsten, or palladium. The surface of portion 22 may be plated with gold etc.

Portion 23 of second source electrode 21 is a layer that connects portion 22 and semiconductor layer 40, and may comprise, as a non-limiting example, a metal material including at least one of aluminum, copper, gold, or silver.

A thickness of second source electrode 21, including the total thickness of portion 22 and portion 23 is, for example, at least 2 [μm] and at most 13 [μm].

The above-described configuration of transistors 10 and 20 allows semiconductor substrate 32 to serve as a common drain region having a first drain region of transistor 10 and a second drain region of transistor 20 in common. A portion of low-concentration impurity layer 33 on a side adjacent to semiconductor substrate 32 may sometimes serve as the common drain region. It should be noted that low-concentration impurity layer 33 is also a common drift layer of transistors 10 and 20, and may be referred to as drift layer 33 in the Specification.

Moreover, metal layer 30 serves as a common drain electrode having a drain electrode of transistor 10 and a drain electrode of transistor 20 in common. When support 42 is a thick metal plate, not only metal layer 30 but also conductive adhesive 41 and thick metal plate 42 serve as the common drain electrode.

As shown in FIG. 1, first body region 18 and first source region 14 are covered with interlayer insulating layer 34 having openings, and portion 13 of first source electrode 11 is connected to first body region 18 and first source region 14 via the openings of interlayer insulating layer 34. Interlayer insulating layer 34 and portion 13 of first source electrode 11 are covered with passivation layer 35 having openings, and portion 13 of first source electrode 11 is connected to portion 12 of first source electrode 11 via the openings of passivation layer 35.

Second body region 28 and second source region 24 are covered with interlayer insulating layer 34 having openings, and portion 23 of second source electrode 21 is connected to second body region 28 and second source region 24 via the openings of interlayer insulating layer 34. Interlayer insulating layer 34 and portion 23 of second source electrode 21 are covered with passivation layer 35 having openings, and portion 23 of second source electrode 21 is connected to portion 22 of second source electrode 21 via the openings of passivation layer 35.

Accordingly, a plurality of first source pads 111 refer to a region in which first source electrode 11 is partially exposed to the surface of semiconductor device 1, that is, a terminal portion; and a plurality of second source pads 121 refer to a region in which second source electrode 21 is partially exposed to the surface of semiconductor device 1, that is, a terminal portion. Similarly, one or more first gate pads 119 refer to a region in which first gate electrode 19 (not shown in FIG. 1, FIG. 2A, FIG. 2B) is partially exposed to the surface of semiconductor device 1, that is, a terminal portion; and one or more second gate pads 129 refer to a region in which second gate electrode 29 (not shown in FIG. 1, FIG. 2A, FIG. 2B) is partially exposed to the surface of semiconductor device 1, that is, a terminal portion.

In the present disclosure, it is assumed that, in the plan view, first region A1 includes only components constituting first vertical MOS transistor 10, and second region A2 includes only components constituting second vertical MOS transistor 20. Moreover, border line 90 may be viewed as a virtual line tracing the central position of a space between portion 13 of first source electrode 11 and portion 23 of second source electrode 21. Furthermore, border line 90 may be viewed as the space itself having a limited width (even when border line 90 is the space, the space can be recognized as a line by appearance to the naked eye or with low magnification).

In semiconductor device 1, for example, assuming that the first conductivity type is N-type and the second conductivity type is P-type, first source region 14, second source region 24, semiconductor substrate 32, and low-concentration impurity layer 33 may be N-type semiconductors, and first body region 18 and second body region 28 may be P-type semiconductors.

Moreover, in semiconductor device 1, for example, assuming that the first conductivity type is P-type and the second conductivity type is N-type, first source region 14, second source region 24, semiconductor substrate 32, and low-concentration impurity layer 33 may be P-type semiconductors, and first body region 18 and second body region 28 may be N-type semiconductors.

[2. Operation of Vertical MOS Transistor in Dual Configuration]

The following describes a conducting operation of semiconductor device 1, assuming transistors 10 and 20 are what is called N-channel type transistors with the first conductivity type being the N type and the second conductivity type being the P type.

Figure 3A:
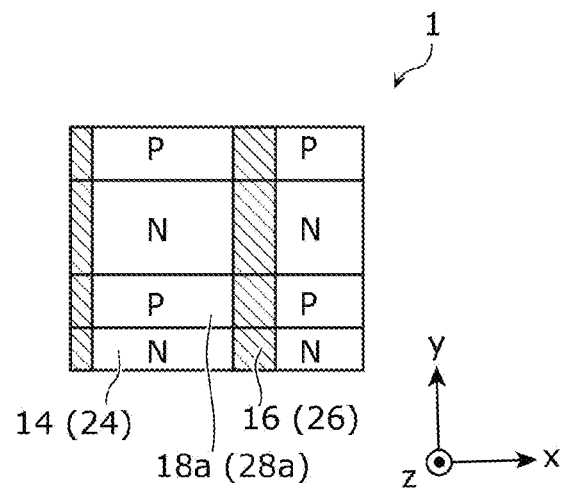
FIG. 3A is a schematic plan view illustrating an example of a structure of the semiconductor device according to Embodiment 1.
Figure 3B:
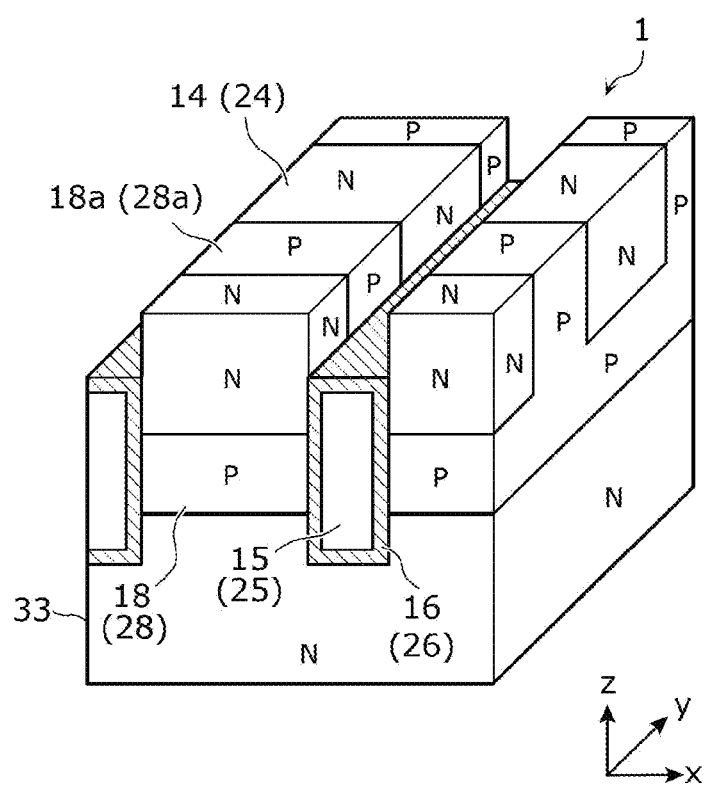
FIG. 3B is a schematic perspective view illustrating an example of the structure of the semiconductor device according to Embodiment 1.

FIG. 3A and FIG. 3B are a plan view and a perspective view of an approximate single unit configuration of transistor 10 (or transistor 20) that is repeatedly formed in an X direction and a Y direction of semiconductor device 1, respectively. For the sake of clarity, neither FIG. 3A nor FIG. 3B illustrates semiconductor substrate 32, metal layer 30, conductive adhesive 41, thick metal plate 42, passivation layer 35, first source electrode 11 (or second source electrode 21), and interlayer insulating layer 34.

Transistor 10 contains the same structure as transistor 20. For this reason, hereinafter, an approximate single unit configuration is described using reference signs for transistor 10.

The Y direction is a direction that is parallel to the top face of semiconductor layer 40 and in which first gate trench 17 extends. The X direction is a direction that is parallel to the top face of semiconductor layer 40 and orthogonal to the Y direction. A Z direction is a direction that is orthogonal to both the X direction and the Y direction and indicates a height direction of semiconductor device 1. In the present disclosure, the Y direction, the X direction, and the Z direction may be referred to as a first direction, a second direction, and a third direction, respectively.

As shown in FIG. 3A and FIG. 3B, transistor 10 includes first connector 18a that electrically connects first body region 18 and first source electrode 11. First connector 18a is a region of first body region 18 in which first source region 14 is not provided, and contains the same impurities of the second conductivity type as those of first body region 18. First source region 14 and first connector 18a are alternately and periodically disposed in the Y direction. The same applies to transistor 20.

In semiconductor device 1, when a high voltage and a low voltage are applied to first source electrode 11 and second source electrode 21, respectively, and a voltage higher than or equal to a threshold value is applied to second gate electrode 29 (second gate conductor 25) with respect to second source electrode 21, a conducting channel is formed in the vicinity of second gate insulating film 26 in second body region 28. As a result, a principal current flows in a pathway from first source electrode 11 to first connector 18a to first body region 18 to low-concentration impurity layer 33 to semiconductor substrate 32 to metal layer 30 to conductive adhesive 41 to thick metal plate 42 to conductive adhesive 41 to metal layer 30 to semiconductor substrate 32 to low-concentration impurity layer 33 to the conducting channel formed in second body region 28 to second source region 24 to second source electrode 21, and semiconductor device 1 becomes conductive. A PN junction is in a contact surface between second body region 28 and low-concentration impurity layer 33 in this conductive pathway and serves as a body diode.

Likewise, in semiconductor device 1, when a high voltage and a low voltage are applied to second source electrode 21 and first source electrode 11, respectively, and a voltage higher than or equal to a threshold value is applied to first gate electrode 19 (first gate conductor 15) with respect to first source electrode 11, a conducting channel is formed in the vicinity of first gate insulating film 16 in first body region 18. As a result, a principal current flows in a pathway from second source electrode 21 to second connector 28a to second body region 28 to low-concentration impurity layer 33 to semiconductor substrate 32 to metal layer 30 to conductive adhesive 41 to thick metal plate 42 to conductive adhesive 41 to metal layer 30 to semiconductor substrate 32 to low-concentration impurity layer 33 to the conducting channel formed in first body region 18 to first source region 14 to first source electrode 11, and semiconductor device 1 becomes conductive. A PN junction is in a contact surface between first body region 18 and low-concentration impurity layer 33 in this conductive pathway and serves as a body diode.

In FIG. 2B, the flow of a bidirectional principal current is schematically indicated by arrows. The flow of the principal current in the horizontal direction (X direction) occurs in each of metal layer 30, conductive adhesive 41, thick metal plate 42, and semiconductor substrate 32. Since metal layer 30 and thick metal plate 42 have a resistivity lower than those of the other layers, it is possible to reduce the on resistance of semiconductor device 1, by thickening metal layer 30 or thick metal plate 42 and increasing the cross-sectional area of a principal current pathway.

[3. Method for Manufacturing Semiconductor Device]

A method for manufacturing semiconductor device 1 is described below.

FIG. 4A shows parts of a manufacturing process for semiconductor device 1 according to Embodiment 1 in a simplified manner. A structure of each vertical MOS transistor in a dual configuration that is to be diced later is formed in a grid shape on a silicon wafer in step 501.

Next, in step 502, a back face side of the silicon wafer (equivalent to semiconductor substrate 32 in each of vertical MOS transistors in a dual configuration to be diced later) is thinned down. In the thinning down in step 502, the thickness of semiconductor layer 40 may be controlled to be at least 15 [μm] and at most 100 [μm], and specifically the thickness of semiconductor layer 40 may be controlled to be at least 15 [μm] and at most 75 [μm].

Then, in step 503, metal layer 30 is formed on a back face of the silicon wafer that has been thinned down. Metal layer 30 may include a multilayer configuration that includes, for example, a plurality of metal layers. The plurality of metal layers may be individually formed by any of vapor deposition, sputtering, and plating.

After that, in step 504, each vertical MOS transistor in the dual configuration is diced by performing dicing on the silicon wafer. Since the diced vertical MOS transistor in the dual configuration is in a state in which thick metal plate 42 is not bonded yet, the vertical MOS transistor can still be referred to as semiconductor chip 2 described earlier.

Finally, in step 505, thick metal plate 42 to which conductive adhesive 41 such as silver paste has been applied in advance is prepared, and is bonded to the back face side of metal layer 30 of semiconductor chip 2. Normally, conductive adhesive 41 is applied to a front face of thick metal plate 42, according to the amount of push on conductive adhesive 41 being pushed into, for example, between 5 [μm] and 10 [μm], and the thickness of conductive adhesive 41 after curing and bonding is calculated to be a target value (e.g., between 20 [μm] and 60 [μm]).

Conductive adhesive 41 is an adhesive for bonding the back face side of metal layer 30 and thick metal plate 42. An entire back face of metal layer 30 may be evenly covered with conductive adhesive 41 in a state in which thick metal plate 42 is bonded after curing of conductive adhesive 41.

Thick metal plate 42 having an area larger than that of semiconductor substrate 32 in the plan view is selected. In bonding, alignment is performed to provide a margin having a substantially equal width from the outer periphery of metal layer 30 to the outer periphery of thick metal plate 42 closest to metal layer 30 in the plan view. As shown in FIG. 2A, as an example, thick metal plate 42 is in a shape similar to that of semiconductor layer 40. Semiconductor layer 40 and thick metal plate 42 being in a similar shape means that semiconductor layer 40 and thick metal plate 42 are in the same shape and differ only in area.

Moreover, when thick metal plate 42 is what is called a flat plate whose in-plane thickness is broadly uniform and that has no steps or asperities, such thick metal plate 42 is conducive to bonding of semiconductor layer 40. In Embodiment 1, thick metal plate 42 is assumed as a flat plate.

Generally, at the time of bonding, semiconductor chip 2 having a relatively small area is fitted to thick metal plate 42 having a relatively large area as a receiving end. Conductive adhesive 41 may protrude from the back face of metal layer 30 in the plan view. The amount of protrusion of conductive adhesive 41 may be or need not be uniform along the outer periphery of semiconductor layer 40 in the plan view. FIG. 2A shows, as an example, a case in which the protrusion of conductive adhesive 41 is uniform.

In step 505, to cause conductive adhesive 41 such as silver paste to cure, heat treatment that heats thick metal plate 42 to approximately 170 [° C.] is performed in a state in which semiconductor chip 2 is fitted to thick metal plate 42. Conductive adhesive 41 starts to cure at around 170 [° C.], and metal layer 30 and thick metal plate 42 are bonded to be semiconductor device 1.

It should be noted that at the time of the heat treatment that heats thick metal plate 42 to 170 [° C.], a warp occurs in semiconductor chip 2. As stated above, semiconductor layer 40 may have a thickness of at least 15 [μm] and at most 75 [μm], and first source electrode 11 and second source electrode 21 may each have a thickness of at least 2 [μm] and at most 13 [μm]. Metal layer 30 may have a thickness of at most 5 [μm]. By selecting each thickness appropriately, it is possible to control a direction of the warp of semiconductor chip 2 at 170 [° C.].

For example, when the thickness of semiconductor layer 40 is caused to be 53 [μm], the thicknesses of first source electrode 11 and second source electrode 21 are caused to be 5 [μm], and the thickness of metal layer 30 is caused to be 3 [μm], a warp that projects in the direction away from thick metal plate 42 (+Z direction in the cross-sectional view in FIG. 1) occurs in semiconductor chip 2 at 170 [° C.].

Figure 4B:
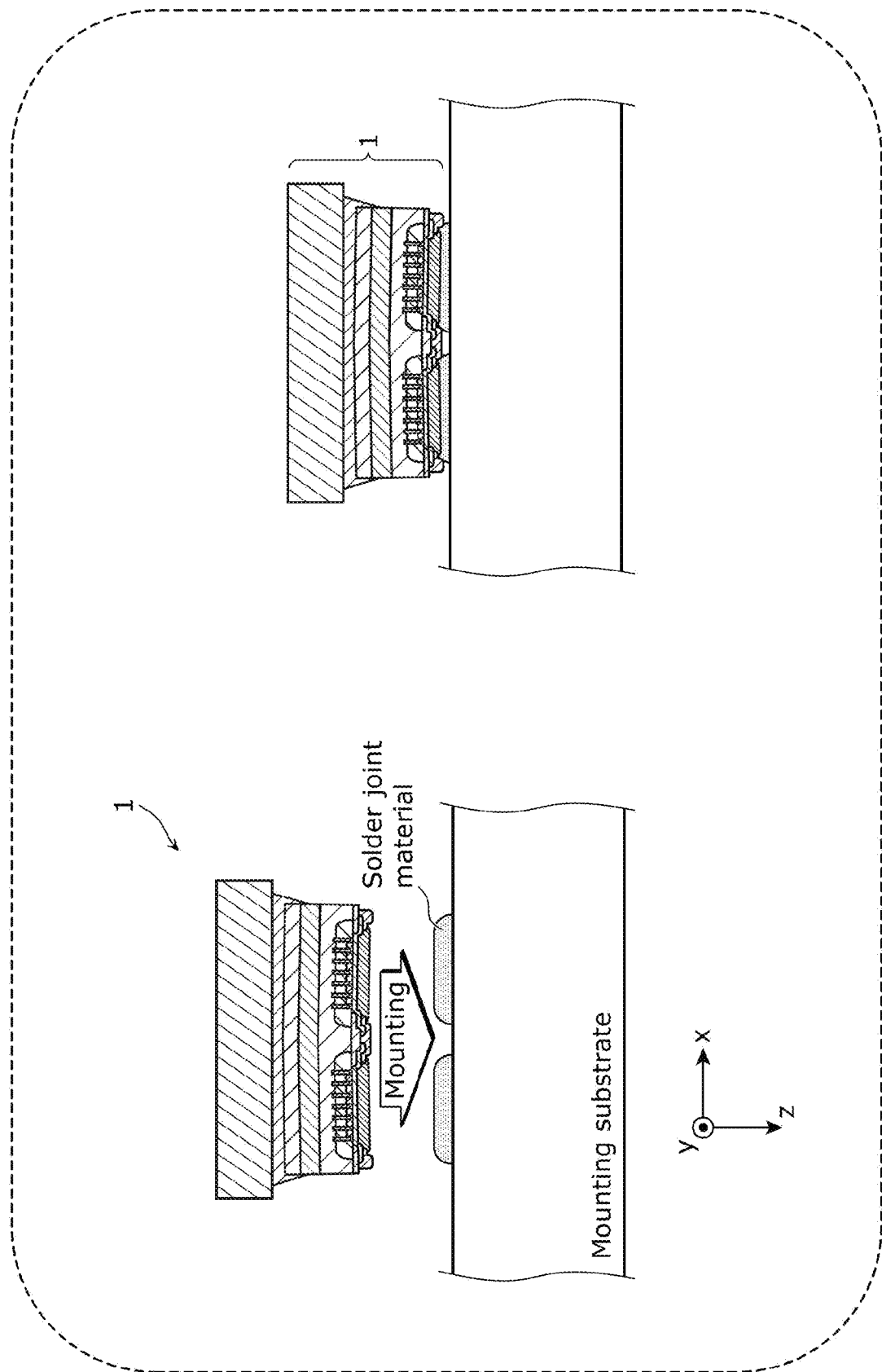
FIG. 4B is a schematic cross-sectional view illustrating a step of facedown mounting the semiconductor device according to Embodiment 1.

FIG. 4B is a schematic diagram when semiconductor device 1 is facedown mounted.

[4. Discussion]

The following describes advantageous effects achieved by semiconductor device 1 according to Embodiment 1.

In a vertical MOS transistor in a dual configuration, to reduce on resistance at the time of conduction, it is required to thin down semiconductor substrate 32 (semiconductor layer 40) and thicken metal layer 30. A warp that projects in the −Z direction at high temperatures is likely to occur in semiconductor chip 2 with such a configuration. The more semiconductor layer 40 is thinned down and the more metal layer 30 is thickened, the larger the warp that occurs at high temperatures becomes.

In particular, when the vertical MOS transistor in the dual configuration that has a low on resistance is required, for the purpose of increasing a total gate width of a channel, it is effective to increase the area of semiconductor chip 2 in a plan view. However, when the area is large, the warp that occurs in semiconductor chip 2 increases remarkably.

When semiconductor chip 2 is facedown mounted on a mounting substrate, it is necessary to perform reflow that heats semiconductor chip 2 to approximately 240 [° C.] using a solder joint material. When the amount of a warp of semiconductor chip 2 at 240 [° C.] exceeds 40 [μm], it is known that a mounting failure is likely to occur regardless of a direction of the warp, and it is required to reduce the amount of the warp of semiconductor chip 2 to be less than 40 [μm].

The configuration of semiconductor device 1 according to Embodiment 1 is especially effective for semiconductor chip 2 as described above, in which semiconductor layer 40 is thin and whose area is large. In semiconductor device 1, support 42 assumed as a thick metal plate is connected to metal layer 30 using conductive adhesive 41. For this reason, when thick metal plate 42 is sufficiently thick, though metal layer 30 is thin, since thick metal plate 42 serves as a conductive pathway in the horizontal direction, it is possible to reduce the on resistance of semiconductor device 1. By thinning down metal layer 30, it is possible to mitigate a warp that occurs in semiconductor chip 2.

Moreover, since semiconductor chip 2 is bonded to thick metal plate 42 at around 170 [° C.] lower than 240 [° C.], it is possible to limit the amount of a warp of semiconductor chip 2 to the amount of a warp that occurs at around 170 [° C.]. When a material that does not remelt such as silver paste is selected as conductive adhesive 41, the warp of semiconductor chip 2 already bonded to thick metal plate 42 does not increase in reflow (240 [° C.]) when semiconductor device 1 is facedown mounted on the mounting substrate.

Moreover, since thick metal plate 42 serves as a support for semiconductor chip 2 when thick metal plate 42 is sufficiently thick, it is possible to compensate for a decrease in strength of semiconductor chip 2 caused by thinning down semiconductor layer 40.

Figure 5:
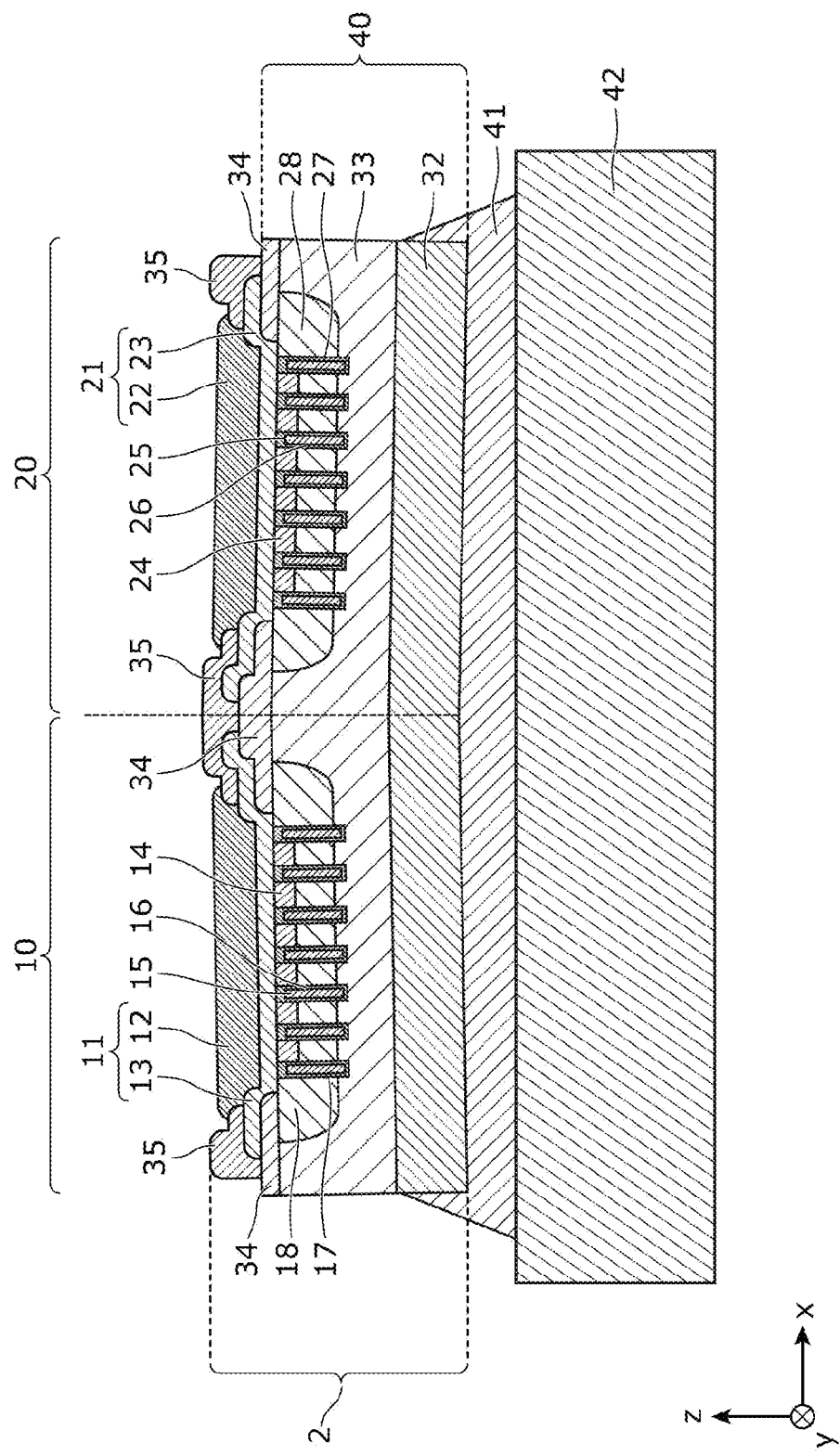
FIG. 5 is a schematic cross-sectional view illustrating an example of a structure of a semiconductor device according to Variation 1 of Embodiment 1.

Accordingly, thick metal plate 42 of semiconductor device 1 according to Embodiment 1 achieves the effect of physically compensating for the thinness of semiconductor layer 40 and electrically compensating for the thinness of metal layer 30. To put it bluntly, metal layer 30 need not be present. In such a case, as in Variation 1 of Embodiment 1 shown in FIG. 5, conductive adhesive 41 is directly bonded to an entire back face of semiconductor substrate 32 (semiconductor layer 40).

The structure of semiconductor device 1 according to Embodiment 1 including thick metal plate 42 is more useful with an increase in area of semiconductor layer 40 in semiconductor chip 2 in the plan view and with a decrease in thickness of semiconductor layer 40. Conversely, it is less meaningful to bond thick metal plate 42 to semiconductor chip 2 in which semiconductor layer 40 has a small area in the plan view and is thick. In view of this, sizes (area and thickness) of semiconductor chip 2 that allow the structure of semiconductor device 1 according to Embodiment 1 including thick metal plate 42 to be useful was considered.

Figure 6:
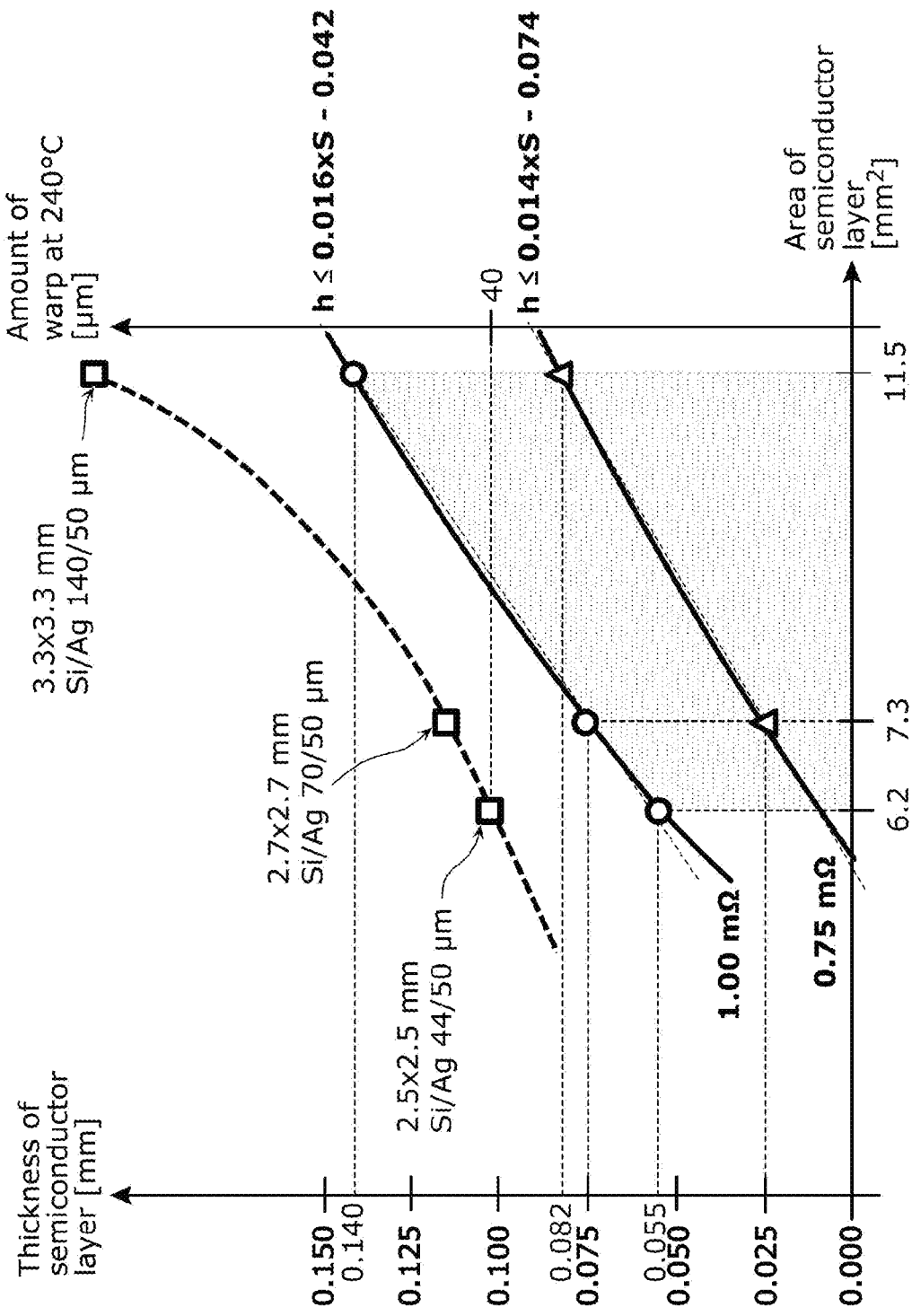
FIG. 6 is a graph indicating a size range for a semiconductor chip that is capable of achieving the effect of the semiconductor device according to Embodiment 1.

FIG. 6 is a graph that indicates areas and thicknesses (from the top face of low concentration impurity layer 33 to the bottom face of semiconductor substrate 32) of semiconductor layer 40 in the plan view that are necessary for causing the on resistance of semiconductor chip 2 to be at least 1 [mΩ], and calculated amounts of a warp of semiconductor chip 2 that occurs at that time. Although 1 [mΩ] is a standard, for example, a low on resistance of at most 1 [mΩ] is required at the time of high-current conduction for which there has been a growing demand in battery protection circuits in recent years.

The horizontal axis indicates area S [mm$^2$] of semiconductor layer 40 in semiconductor chip 2 in the plan view, and the left vertical axis indicates thickness h [mm] of semiconductor layer 40 in semiconductor chip 2. Semiconductor layer 40 is formed into a square shape. For example, 2.5×2.5 [mm] is equivalent to an area of 6.2 [mm$^2$], and 3.4×3.4 [mm] is equivalent to an area of 11.5 [mm$^2$]. Circles on the graph each indicate a thickness of semiconductor layer 40 when the on resistance of semiconductor chip 2 is just 1.00 [mΩ]. Triangles on the graph each indicate a thickness of semiconductor layer 40 when the on resistance of semiconductor chip 2 is just 0.75 [mΩ]. In semiconductor chip 2 when the thicknesses of semiconductor layer 40 are calculated, it is assumed that metal layer 30 comprises silver (Ag) as a material and has a thickness of 50 [μm].

In order to achieve a low on resistance of at most 1.00 [mΩ], it is necessary to cause semiconductor chip 2 to include a structure that fits into a region that includes a curve connecting the circles and is lower than the curve. Although it is necessary to thin down semiconductor layer 40 when the area of semiconductor layer 40 in semiconductor chip 2 in the plan view is small, it is possible to thicken semiconductor layer 40 to a certain extent when the area of semiconductor layer 40 in semiconductor chip 2 in the plan view is large.

A line connecting the circles satisfies approximately h=0.016×S−0.042 (a dashed line in FIG. 6, favorable accuracy where 6.2≤S≤11.5). Accordingly, in order to cause the on resistance to be at most 1.00 [mΩ], semiconductor layer 40 in semiconductor chip 2 is required to satisfy h≤0.016× S−0.042.

A line connecting the triangles satisfies approximately h=0.014×S−0.074 (a dashed line in FIG. 6, favorable accuracy where 6.2≤S≤11.5). Accordingly, in order to cause the on resistance to be at most 0.75 [mΩ], semiconductor layer 40 in semiconductor chip 2 is required to satisfy h≤0.014× S−0.074.

The right vertical axis in FIG. 6 indicates the amount of a warp [μm] that occurs when semiconductor chip 2 is at a high temperature of 240 [° C.]. Squares on the graph each indicate the amount of a warp that occurs when metal layer 30 is formed to have a thickness of 50 [μm] of Ag in the configuration (area S and thickness h) of semiconductor layer 40 in semiconductor chip 2 indicated by a corresponding one of the circles. The reason why metal layer 30 included in semiconductor chip 2 is set to the thickness of 50 [μm] of Ag is to allow a comparison with the structure of semiconductor device 1 according to Embodiment 1 including thick metal plate 42. A material comprised in metal layer 30 is Ag having a favorable resistivity, and the thickness of 50 [μm] that substantially saturates a contribution to the reduction of the on resistance is selected.

It should be noted that the reason why semiconductor layer 40 is formed into the square shape in the plan view is that a square shape decreases the amount of a warp the most even when the same configuration (area S and thickness h) is used. Accordingly, the squares in FIG. 5 each indicate the smallest amount of a warp in a state of semiconductor chip 2 that is electrically comparable to semiconductor device 1 according to Embodiment 1.

According to FIG. 6, when it is required to cause the on resistance to be at most 1.00 [mΩ], it is clear that the amount of a warp at 240 [° C.] exceeds 40 [μm], with the area of at least 6.2 [mm$^2$]. For this reason, when the area is at least 6.2 [mm$^2$], it is difficult to perform mounting without changing semiconductor chip 2, and measures capable of decreasing the amount of a warp are necessary.

When, although the on resistance is 1.00 [mΩ], the area of semiconductor chip 2 in the plan view is less than 6.2 [mm$^2$], the amount of a warp falls below 40 [μm]. For this reason, it is possible to perform mounting without changing semiconductor chip 2. Moreover, when, although the area of semiconductor chip 2 in the plan view is 6.2 [mm$^2$], the on resistance may exceed 1.00 [mΩ], it is unnecessary to thin down semiconductor layer 40 excessively. For this reason, the amount of a warp falls below 40 [μm], and it is possible to perform mounting without changing semiconductor chip 2.

Accordingly, when it is required to cause the on resistance to be at most 1.00 [mΩ] with regard to semiconductor chip 2 that is in the square shape in the plan view and has the area of at least 6.2 [mm$^2$](2.5×2.5 [mm]), that is, when h≤0.016× S−0.042 is satisfied for semiconductor layer 40 in semiconductor chip 2, thick metal plate 42 may be bonded to semiconductor chip 2, as with semiconductor device 1 according to Embodiment 1.

Furthermore, when it is required to cause the on resistance to be, for example, at most 0.75 [mΩ], it is necessary to further thin down semiconductor layer 40 in semiconductor chip 2. In other words, when h≤0.014×S−0.074 is satisfied for semiconductor layer 40 in semiconductor chip 2, it is more favored for thick metal plate 42 to be bonded to semiconductor chip 2, as with semiconductor device 1 according to Embodiment 1.

Semiconductor device 1 according to Embodiment 1 is capable of controlling the warp of semiconductor chip 2 at 170[° C.] to project in the direction away from support 42 (+Z direction), by selecting the thickness of each of semiconductor layer 40 (semiconductor substrate 32), first source electrode 11, second source electrode 21, and metal layer 30 appropriately.

As shown in FIG. 1, when the back face of metal layer 30 warps to project in the direction away from thick metal plate 42 (+Z direction) as seen from thick metal plate 42, conductive adhesive 41 is sandwiched between metal layer 30 and thick metal plate 42. In particular, a curvature of semiconductor chip 2 brings end portions of metal layer 30 relatively closer to thick metal plate 42 (−Z direction), which pushes conductive adhesive 41 toward thick metal plate 42. When semiconductor chip 2 is in such a curved shape, it is possible to achieve the effect of increasing a degree of adhesion in bonding of semiconductor chip 2 and thick metal plate 42.

Accordingly, when semiconductor chip 2 of semiconductor device 1 excluding thick metal plate 42 and conductive adhesive 41 is seen in the cross-sectional view of semiconductor device 1, semiconductor chip 2 may be in a curved shape that projects in the direction away from thick metal plate 42. In other words, a thickness of conductive adhesive 41 immediately below semiconductor layer 40 in the outer periphery of semiconductor layer 40 in the plan view may be less than a thickness of conductive adhesive 41 immediately below semiconductor layer 40 at the center of semiconductor layer 40 in the plan view.

Figure 7B:
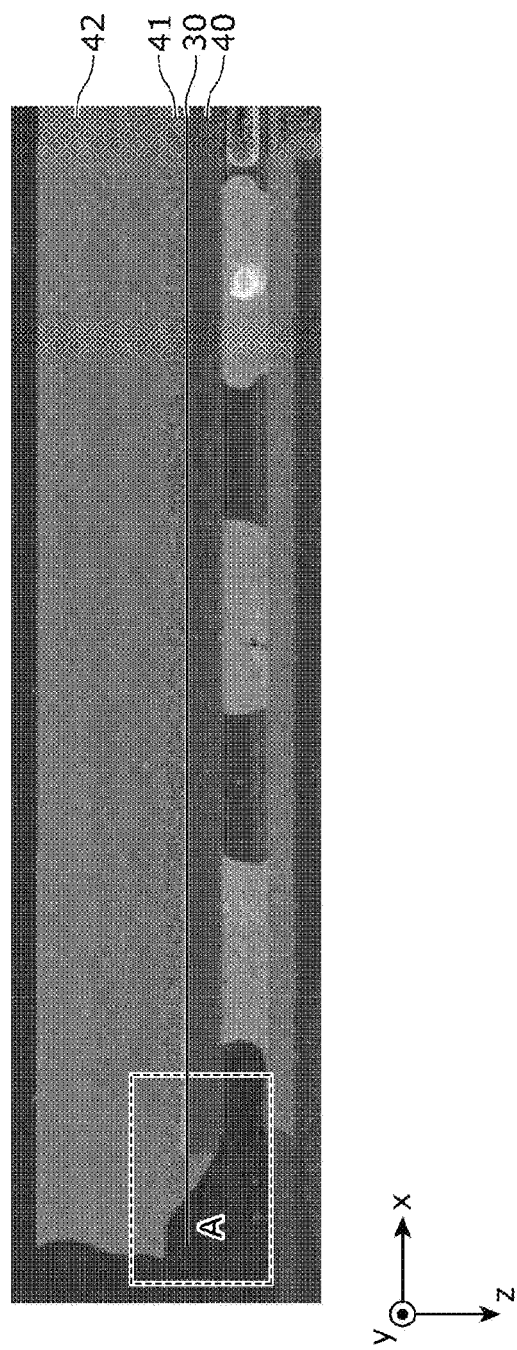
FIG. 7B is a cross-sectional SEM image showing an example of the structure of the semiconductor device according to Embodiment 1.
Figure 7C:
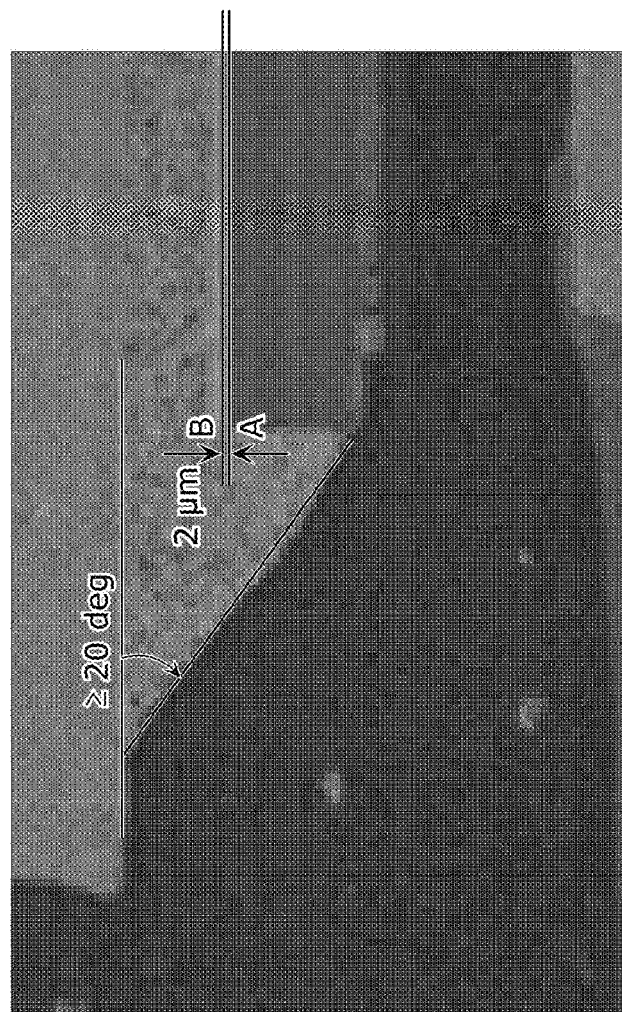
FIG. 7C is a cross-sectional SEM image showing an example of the structure of the semiconductor device according to Embodiment 1.

FIG. 7A, FIG. 7B, and FIG. 7C each show a cross-sectional SEM image when semiconductor device 1 according to Embodiment 1 is facedown mounted on the mounting substrate. FIG. 7B is an enlarged cross-sectional SEM image of the portion surrounded by the dashed line in FIG. 7A, and FIG. 7C is an enlarged cross-sectional SEM image of the portion surrounded by the dashed line in FIG. 7B. In semiconductor device 1 shown in FIG. 7A to FIG. 7C, the thickness of semiconductor layer 40 is 53 [μm], the thicknesses of first source electrode 11 and second source electrode 21 are 4 [μm], the thickness of metal layer 30 is 3 [μm], and the thickness of thick metal plate 42 is 200 [μm].

Horizontal line A in FIG. 7B and FIG. 7C shows the position of an interface between semiconductor layer 40 and metal layer 30 at the center of semiconductor layer 40 in the plan view, up to the outer periphery of semiconductor layer 40 in the plan view. Moreover, horizontal line B in FIG. 7C shows the position of an interface between semiconductor layer 40 and metal layer 30 in the outer periphery of semiconductor layer 40. In FIG. 7C, horizontal line B is on a side closer to thick metal plate 42 (−Z direction) than horizontal line A is, and a distance between horizontal line A and horizontal line B in the Z direction is 2 [μm].

Accordingly, semiconductor chip 2 is in a warped shape that projects in the direction away from thick metal layer 42 (+Z direction), and the amount of the warp is 2 [μm]. Conductive adhesive 41 that bonds semiconductor chip 2 and thick metal plate 42 cures to be sandwiched between semiconductor chip 2 and thick metal plate 42, and covers an entire back face of semiconductor chip 2. No portions where one or more voids occur or no portions likely to come off are found in conductive adhesive 41, and it is possible to confirm that conductive adhesive 41 has a favorable degree of adhesion.

The results of the consideration by the inventors show that, when the amount of the warp of semiconductor chip 2 at 170[° C.] is at least 2 [μm], it is possible to stably achieve the effect of increasing a degree of adhesion. When the amount of the warp falls below 2 [μm] or the warp projects in an opposite direction, the effect of sandwiching conductive adhesive 41 between semiconductor chip 2 and thick metal plate 42 is not stably achieved, and traces of conductive adhesive 41 coming off at end portions of semiconductor device 1 may be found.

Warping of semiconductor chip 2 at high temperatures results from first source electrode 11 and second source electrode 21 being formed on the front face side of semiconductor layer 40. Moreover, when metal layer 30 is included on the back face side of semiconductor layer 40, the formation of metal layer 30 also makes an impact. A direction of a warp (also referred to as a direction of a curvature) and the amount of the warp (also referred to as the amount of the curvature) of semiconductor chip 2 are determined by a relation between (i) a physical property value such as a coefficient of linear expansion or a Young's modulus of each of semiconductor layer 40, first source electrode 11, second source electrode 21, and metal layer 30 and (ii) the thickness of each of semiconductor layer 40, first source electrode 11, second source electrode 21, and metal layer 30.

When semiconductor chip 2 does not include metal layer 30 (in Variation 1 of Embodiment 1 shown in FIG. 5), a warp of semiconductor chip 2 is determined only by a relation between (i) semiconductor layer 40 and (ii) first source electrode 11 and second source electrode 21. Since a coefficient of linear expansion is usually larger for a metal type, a warp that occurs at high temperatures projects in the +Z direction. The amount of the warp is determined by a relative relation between (i) the thickness of semiconductor layer 40 and (ii) the thicknesses of first source electrode 11 and second source electrode 21, and increases with a decrease in thickness of semiconductor layer 40 and an increase in thickness of first source electrode 11 and second source electrode 21.

When semiconductor chip 2 includes metal layer 30, a warp of semiconductor chip 2 is determined only by a relation mainly between (i) metal layer 30 and (ii) first source electrode 11 and second source electrode 21. Furthermore, since a coefficient of linear expansion of a metal type included in each of first source electrode 11 and second source electrode 21 and a coefficient of linear expansion of a metal type included in metal layer 30 are often approximate values, a direction of the warp and the amount of the warp of semiconductor chip 2 are often determined only by the thickness of each of metal layer 30, first source electrode 11, and second source electrode 21. When it is required to control the warp to project in the +Z direction, the thickness of metal layer 30 may be made less than the thickness of first source electrode 11 and the thickness of second source electrode 21. This is because stress due to expansion increases with an increase in thickness at high temperatures, and semiconductor chip 2 is in a curved shape that projects in the direction.

As stated above, in order to increase the degree of adhesion in bonding of metal layer 30 and thick metal plate 42, semiconductor chip 2 is required to warp in the direction away from thick metal plate 42 (+Z direction). However, when the amount of the warp is too large, one or more voids are likely to occur in conductive adhesive 41 in the vicinity of the center of semiconductor layer 40 in the plan view. The results of the consideration by the inventors show that, when the amount of the warp of semiconductor chip 2 at 170[° C.] is adjusted to be at most 20 [μm], it is possible to stably prevent one or more voids from occurring. Accordingly, the amount of the warp of semiconductor chip 2 at 170[° C.] may be at least 2 [μm] and at most 20 [μm].

In order for semiconductor chip 2 to be in the curved shape that projects in the direction away from thick metal plate 42 (+Z direction), in semiconductor chip 2, semiconductor layer 40 may have a thickness of at most 100 [μm], and may have a thickness of more specifically at most 75 [μm]. This is because it is difficult to form extremely thick first source electrode 11 and second source electrode 21, and it is easier to cause semiconductor chip 2 to warp when semiconductor layer 40 is thinner. Moreover, since it is possible to compensate for a decrease in strength of semiconductor chip 2 caused by thinning down semiconductor layer 40, by bonding thick metal plate 42 to semiconductor chip 2, the present disclosure makes it possible to reduce the side effects caused by thinning down semiconductor layer 40.

However, when semiconductor layer 40 becomes extremely thin, for example, less than 15 [μm], one or more cracks are likely to occur in semiconductor layer 40 (semiconductor substrate 32) at the time of dicing. Accordingly, semiconductor layer 40 may have a thickness of at least 15 [μm] and at most 100 [μm], and may have a thickness of more specifically at least 15 [μm] and at most 75 [μm].

First source electrode 11 and second source electrode 21 may each have a thickness of, for example, at least 2 [μm] and at most 13 [μm]. When semiconductor chip 2 does not include metal layer 30, as long as semiconductor layer 40 is thin, even though first source electrode 11 and second source electrode 21 each have a thickness of 2 [μm] to 5 [μm], it is possible to cause the amount of the warp at 170 [° C.] to be at least 2 [μm]. However, when semiconductor layer 40 is thick, the thickness of first source electrode 11 and the thickness of second source electrode 21 may be made greater in a corresponding manner, such as from 10 [μm] to 13 [μm].

The above thickness configuration makes it possible to control a warp direction of semiconductor chip 2 at high temperatures to be in the direction away from thick metal plate 42 (+Z direction), and further control the amount of the warp to be at least 2 [μm] and at most 20 [μm].

As schematically shown in FIG. 1, in semiconductor device 1 according to Embodiment 1, conductive adhesive 41 partially rises to lateral faces of semiconductor chip 2 to often form a fillet in a substantially triangular shape. In semiconductor device 1 according to Embodiment 1, as shown in FIG. 7A to FIG. 7C, the fillet of conductive adhesive 41 may reach a position close to the top face of semiconductor layer 40 due to semiconductor chip 2 being in the curved shape that projects in the direction away from thick metal plate 42.

As shown in FIG. 7C, it was found that, when an angle of the fillet is defined with reference to the top face of thick metal plate 42, in semiconductor device 1 according to Embodiment 1, the fillet has an angle of 20 [deg] at a minimum. Accordingly, there is a possibility that conductive adhesive 41 protrudes from the outer periphery of semiconductor layer 40 in the plan view, by as much as (h+hp)/tan (20 [deg]) [mm] at a maximum. Here, a total thickness of metal layer 30 and conductive adhesive 41 immediately below a corner portion of semiconductor layer 40 in the plan view is denoted by hp [mm]. The reason why the corner portion of semiconductor layer 40 is designated is that the corner portion is a portion where a warp of semiconductor chip 2 pushes conductive adhesive 41 most. In addition, tan denotes the tangent function.

Supposing that the area of thick metal plate 42 is not sufficiently large compared to the area of semiconductor layer 40 in the plan view, there are concerns regarding the protrusion of conductive adhesive 41 not remaining within thick metal plate 42. Accordingly, it is necessary to prepare the area of thick metal plate 42 in the plan view in consideration of the protrusion of conductive adhesive 41 by the length of the base of the fillet of conductive adhesive 41.

Since the fillet of conductive adhesive 41 has the minimum angle of 20 [deg], L≥(h+hp)/tan(20 [deg]) may be satisfied, where the shortest length of the closest distance from the outer periphery of semiconductor layer 40 to the outer periphery of thick metal plate 42 in the plan view is denoted by L [mm], the thickness of semiconductor layer 40 is denoted by h [mm], and the total thickness of metal layer 30 and conductive adhesive 41 immediately below semiconductor layer 40 in the corner portion of semiconductor layer 40 in the plan view is denoted by hp [mm]. When this relation is satisfied, protruding conductive adhesive 41 does not go beyond the outer periphery of thick metal plate 42 in the entire periphery of semiconductor layer 40 in the plan view.

The following describes variations of semiconductor device 1 according to Embodiment 1.

Figure 8A:
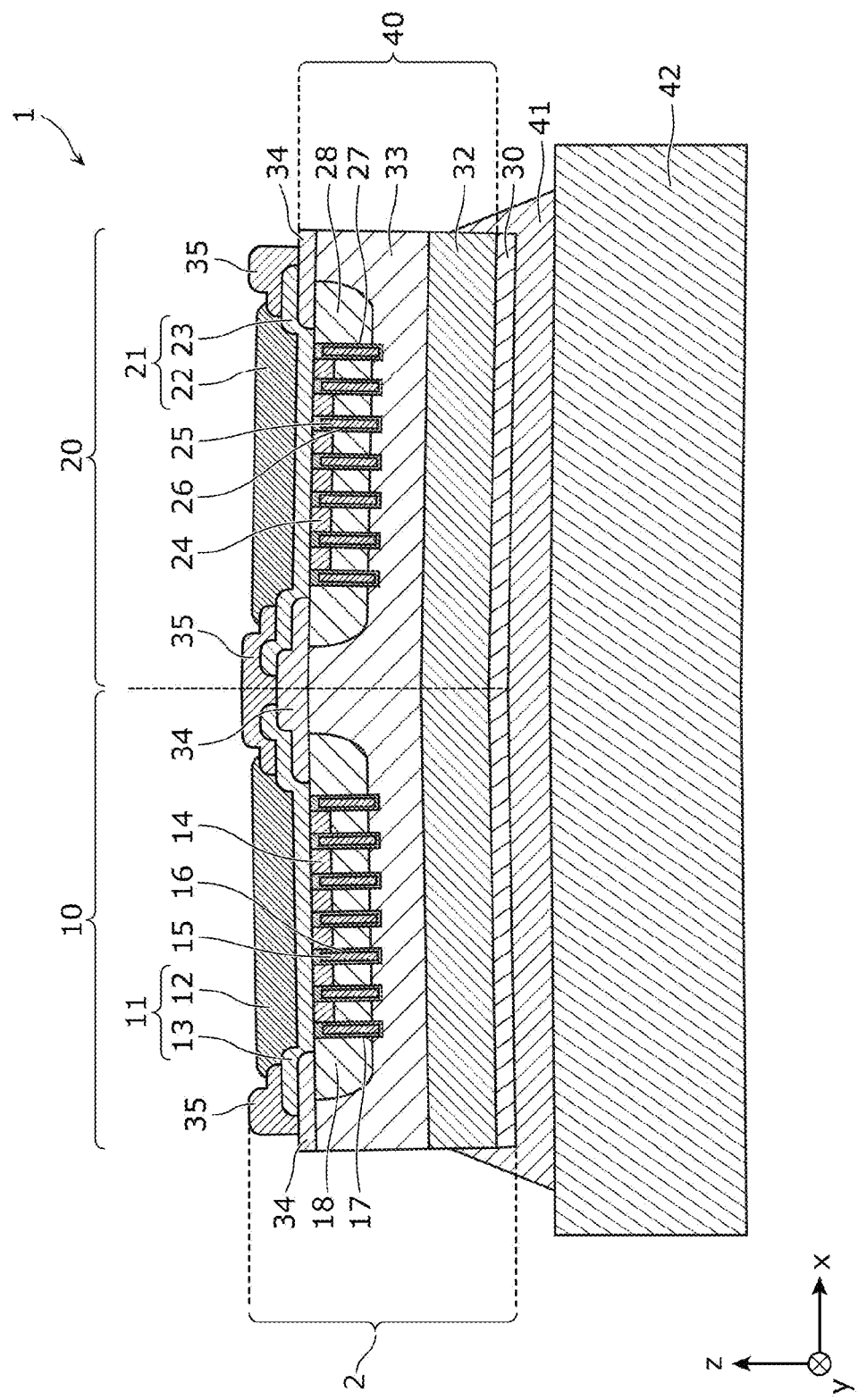
FIG. 8A is a schematic cross-sectional view illustrating an example of a structure of a semiconductor device according to Variation 2 of Embodiment 1.

FIG. 8A is a schematic cross-sectional view illustrating Variation 2 of semiconductor device 1 according to Embodiment 1. In semiconductor device 1 according to Variation 2, support 42 is in a curved shape that projects in a direction toward semiconductor chip 2. The curved shape of support 42 refers to, for example, a shape that results from a warp of support 42 at the time of heat treatment when metal layer 30 and support 42 are bonded via conductive adhesive 41. The amount of a warp of support 42 is a difference between the highest position and the lowest position in the Z direction in a top face or a bottom face of support 42 in a cross-sectional view of support 42. When a warp that occurs in support 42 is a warp that projects in the direction toward semiconductor chip 2, the highest position is the center of support 42 in the plan view, and the lowest position is the outer periphery of support 42, especially corner portions located in the outer periphery, in the plan view.

By adjusting one or more of the following: the amount of a warp of semiconductor chip 2 that occurs at 170 [° C.], at least one of the thickness or the material of support 42, at least one of the thickness or the material of conductive adhesive 41, and bonding conditions, it is possible to control the direction of a warp or the amount of a warp of support 42. The easiest adjustment method is thinning down support 42. When support 42 is thinned down, it is possible to increase the amount of a warp of support 42 at the completion of semiconductor device 1, but rigidity as semiconductor device 1 is decreased. For this reason, as a guideline, the thickness of support 42 may be designed to cause the amount of a warp of support 42 to be smaller than the amount of a warp of semiconductor chip 2.

As shown in FIG. 8A, in semiconductor device 1, since a push on conductive adhesive 41 is reduced when the amount of curvature of support 42 is smaller than the amount of curvature of semiconductor chip 2, and support 42 is in the curved shape that projects in the direction toward semiconductor chip 2, compared to a case in which support 42 is not in the curved shape, it is possible to reduce a length by which conductive adhesive 41 protrudes from semiconductor layer 40 in the plan view.

Figure 8B:
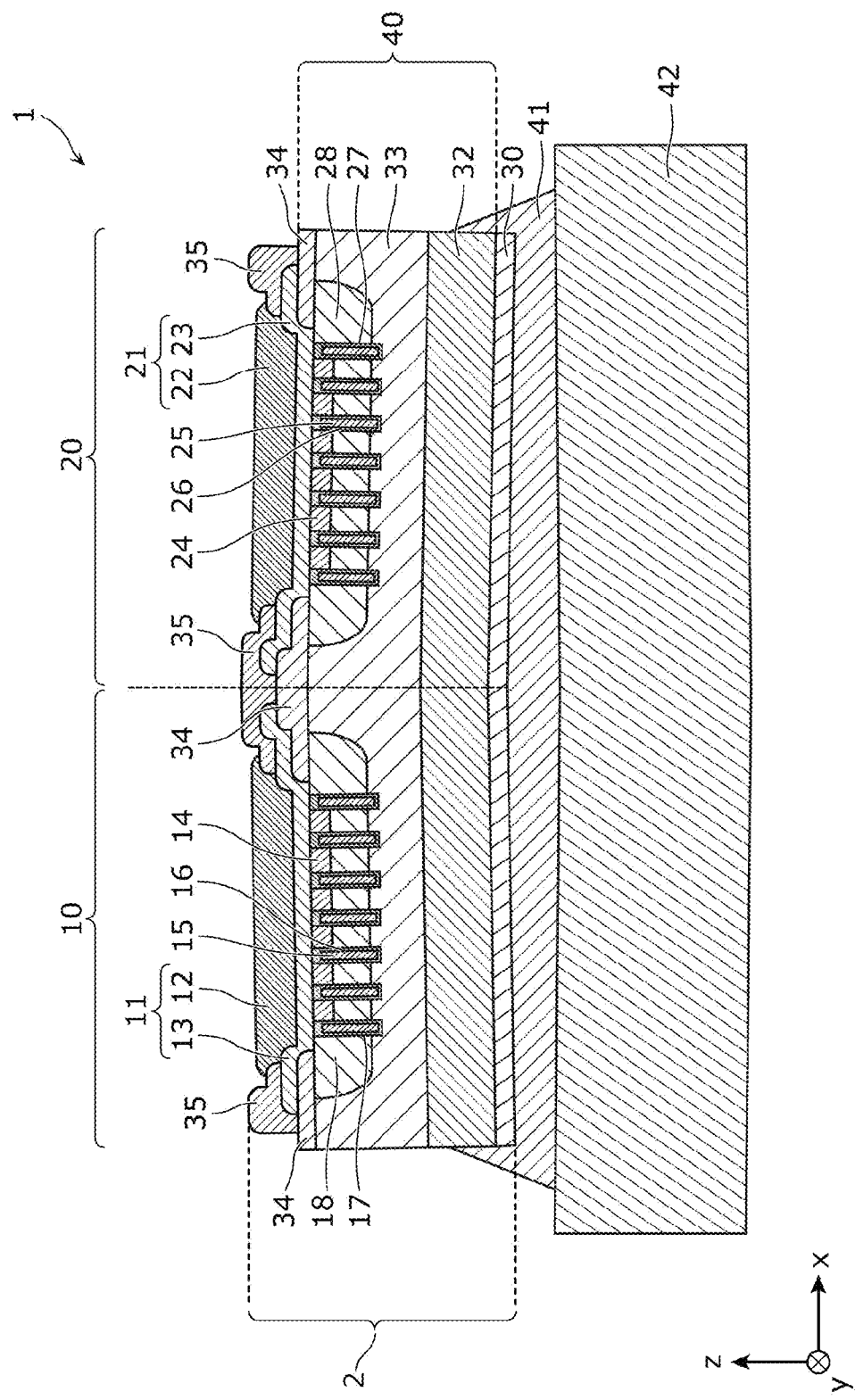
FIG. 8B is a schematic cross-sectional view illustrating an example of a structure of a semiconductor device according to Variation 3 of Embodiment 1.

FIG. 8B is a schematic cross-sectional view illustrating Variation 3 of semiconductor device 1 according to Embodiment 1. In semiconductor device 1 according to Variation 3, support 42 is in a curved shape that projects in a direction away from semiconductor chip 2. As shown in FIG. 8B, in semiconductor device 1, when the amount of curvature of support 42 is smaller than the amount of curvature of semiconductor chip 2, and support 42 is in the curved shape that projects in the direction away from semiconductor chip 2, it is possible to prevent one or more voids from occurring between semiconductor chip 2 and conductive adhesive 41 in the vicinity of the center of semiconductor layer 40 in the plan view, compared to a case in which support 42 is not in the curved shape.

Embodiment 2

Hereinafter, semiconductor device 100 according to Hereinafter, Embodiment 2 obtained by changing part of the configuration of semiconductor device 1 according to Embodiment 1 is described.

Semiconductor device 100 according to Embodiment 2 includes an example of a configuration in which support 42 that is the thick metal plate in Embodiment 1 is replaced with insulating support 420, and support metal layer 300 is provided on a front face side of insulating support 420, that is, a face side of insulating support 420 bonded to semiconductor chip 2.

Here, constituent elements of semiconductor device 100 according to Embodiment 2 that are common to semiconductor device 1 according to Embodiment 1 are given the same reference signs, and the detailed description thereof is omitted, as they have already been described. The following description focuses mainly on differences from semiconductor device 1.

[1. Configuration of Semiconductor Device]

Figure 9:
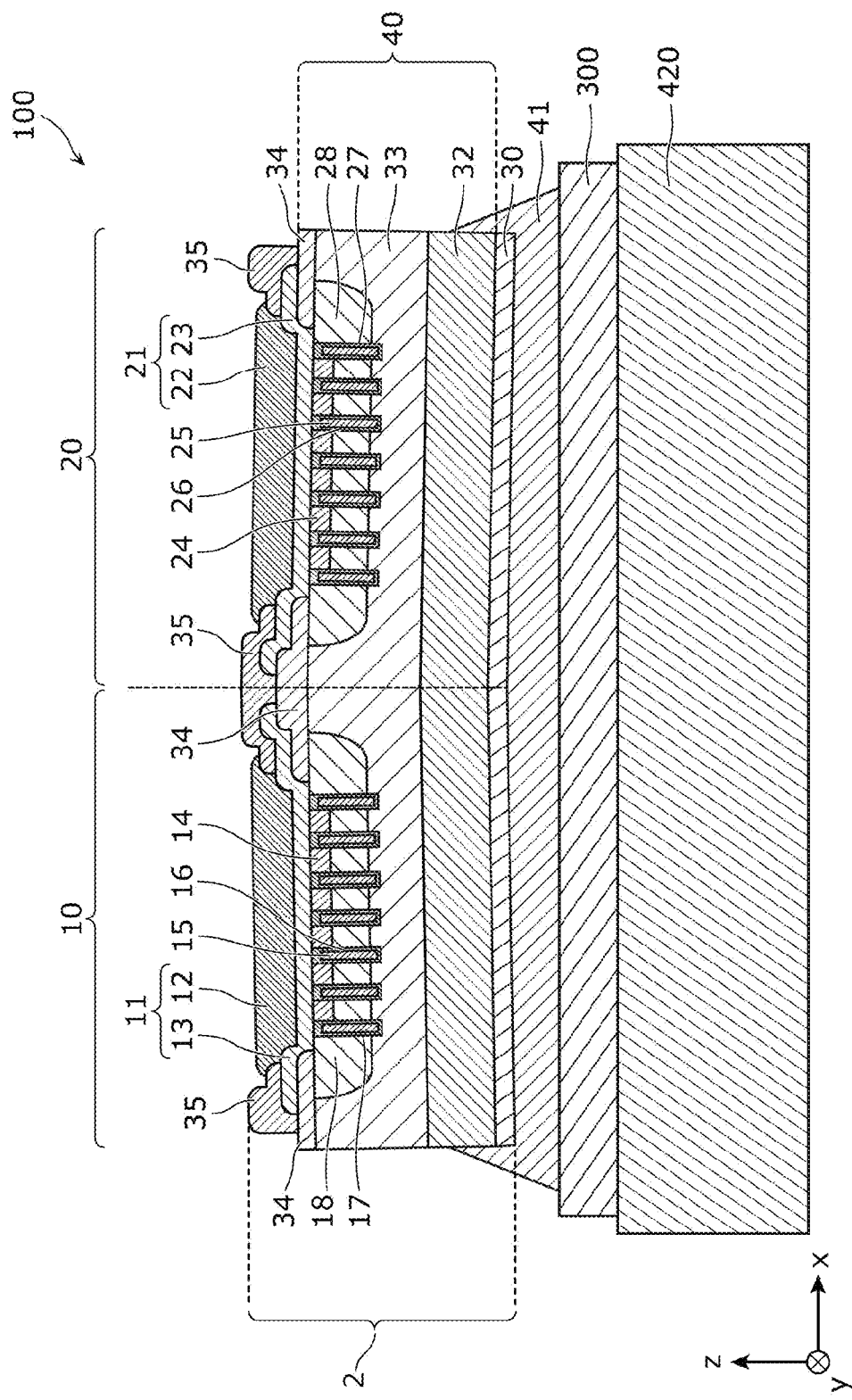
FIG. 9 is a schematic cross-sectional view illustrating an example of a structure of a semiconductor device according to Embodiment 2.

FIG. 9 is a schematic cross-sectional view of semiconductor device 100 according to Embodiment 2. Semiconductor device 100 according to Embodiment 2 differs from semiconductor device 1 according to Embodiment 1 in that support 42 is replaced with insulating support 420, and support metal layer 300 is provided on the front face side of insulating support 420. Support metal layer 300 may cover the entire front face of insulating support 420 to align lateral faces of support metal layer 300 with lateral faces of insulating support 420. Additionally, as shown in FIG. 9, support metal layer 300 may cover only a portion of the front face of insulating support 420.

[2. Method for Manufacturing Semiconductor Device]

Figure 10:
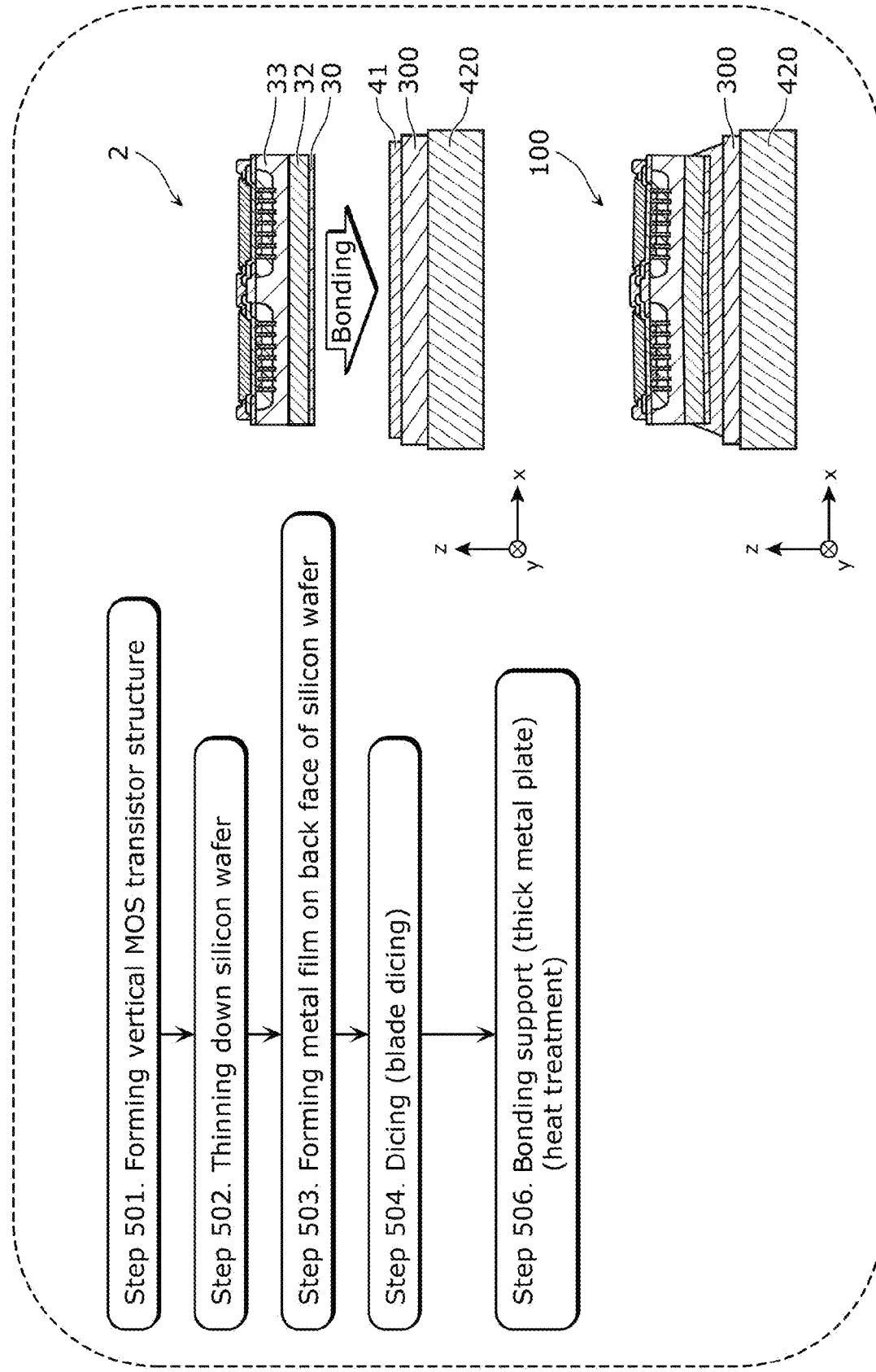
FIG. 10 is a flow chart illustrating parts of a manufacturing process for the semiconductor device according to Embodiment 2.

FIG. 10 shows parts of a manufacturing process for semiconductor device 100 according to Embodiment 2 in a simplified manner. Steps 501 to 504 are the same as those of the manufacturing process for semiconductor device 1 according to Embodiment 1. Step 506 is equivalent to step 505 in Embodiment 1.

In Embodiment 2, semiconductor chip 2 is bonded to insulating support 420 in step 506. In step 506, support metal layer 300 is provided on the front face of insulating support 420 in advance, and conductive adhesive 41 is applied to a top face of support metal layer 300. Conductive adhesive 41 is, for example, silver paste, cures by being heated to 170 [° C.], and bonds semiconductor chip 2 and insulating support 420 or support metal layer 300.

[3. Discussion]

Since insulating support 420 is used in semiconductor device 100 according to the present embodiment, it is possible to increase rigidity more than the thick metal plate according to Embodiment 1 does. Examples of a material having a favorable rigidity include a silicon substrate. When a silicon substrate is used as insulating support 420, it is possible to achieve the same effects as the effects achieved by using the thick metal plate in semiconductor device 1 according to Embodiment 1 with tinner sizes.

On the other hand, in semiconductor device 100 according to Embodiment 2, since support metal layer 300 is provided on the front face of insulating support 420, it is possible to achieve a sufficiently low on resistance using support metal layer 300 as a conductive pathway. In particular, semiconductor device 100 according to Embodiment 2 becomes effective when the thickness of support metal layer 300 is greater than the thickness of first source electrode 11 and the thickness of second source electrode 21 in semiconductor chip 2.

In semiconductor device 1 according to Embodiment 1, when the thickness of metal layer 30 is made greater than the thickness of first source electrode 11 and the thickness of second source electrode 21 in semiconductor chip 2, it is not possible to control a warp that occurs in semiconductor chip 2 at 170 [° C.] to project in the direction away from support 42. In contrast, in semiconductor device 100 according to Embodiment 2, when the thickness of metal layer 30 is made less than the thickness of first source electrode 11 and the thickness of second source electrode 21 in semiconductor chip 2, it is possible to control a warp that occurs in semiconductor chip 2 at 170 [° C.] to project in the direction away from support 42.

Support metal layer 300 may cover an entire range in which a back face side of semiconductor chip 2 is bonded to support metal layer 300. Accordingly, support metal layer 300 provided in a range larger than the area of semiconductor layer 40 in the plan view may be provided on a front face side of insulating support 420, and the thickness of support metal layer 300 may be greater than the thickness of first source electrode 11 and the thickness of second source electrode 21.

Embodiment 3

Hereinafter, semiconductor device 200 according to Embodiment 3 obtained by changing part of the configuration of semiconductor device 1 according to Embodiment 1 is described.

Semiconductor device 200 according to Embodiment 3 includes an example of a configuration in which support 42 that is the thick metal plate in Embodiment 1 and a flat plate having a uniform in-plane thickness is replaced with processed support 430 that is a thick metal plate and the surface of which is processed.

Here, constituent elements of semiconductor device 200 according to Embodiment 3 that are common to semiconductor device 1 according to Embodiment 1 are given the same reference signs, and the detailed description thereof is omitted, as they have already been described. The following description focuses mainly on differences from semiconductor device 1.

[1. Configuration of Semiconductor Device]

Figure 11A:
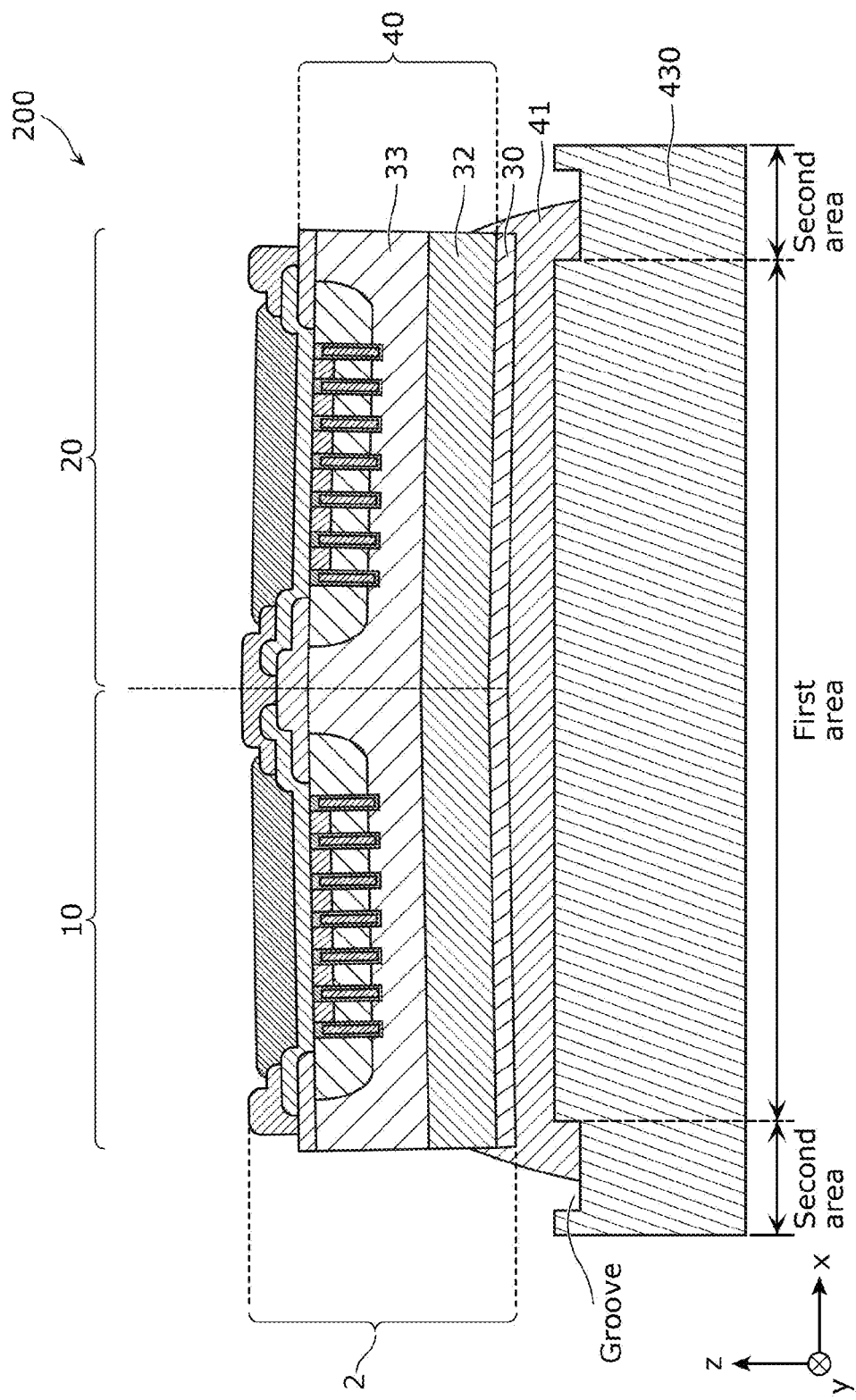
FIG. 11A is a schematic cross-sectional view illustrating an example of a structure of a semiconductor device according to Embodiment 3.
Figure 11B:
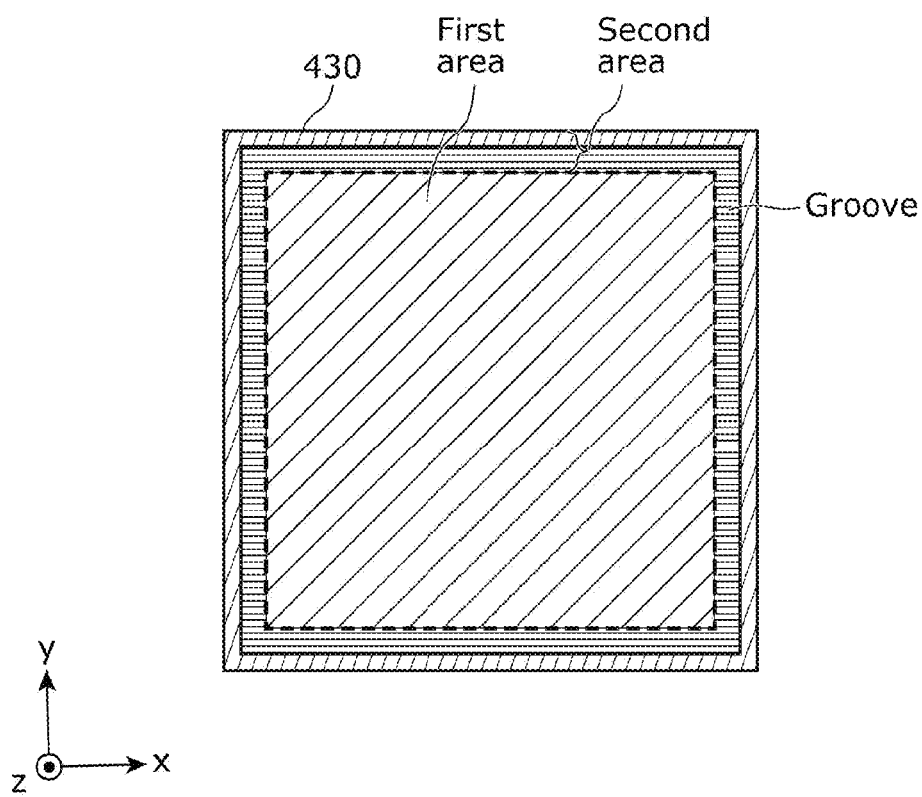
FIG. 11B is a schematic plan view illustrating an example of a structure of a processed support included in the semiconductor device according to Embodiment 3.
Figure 11C:
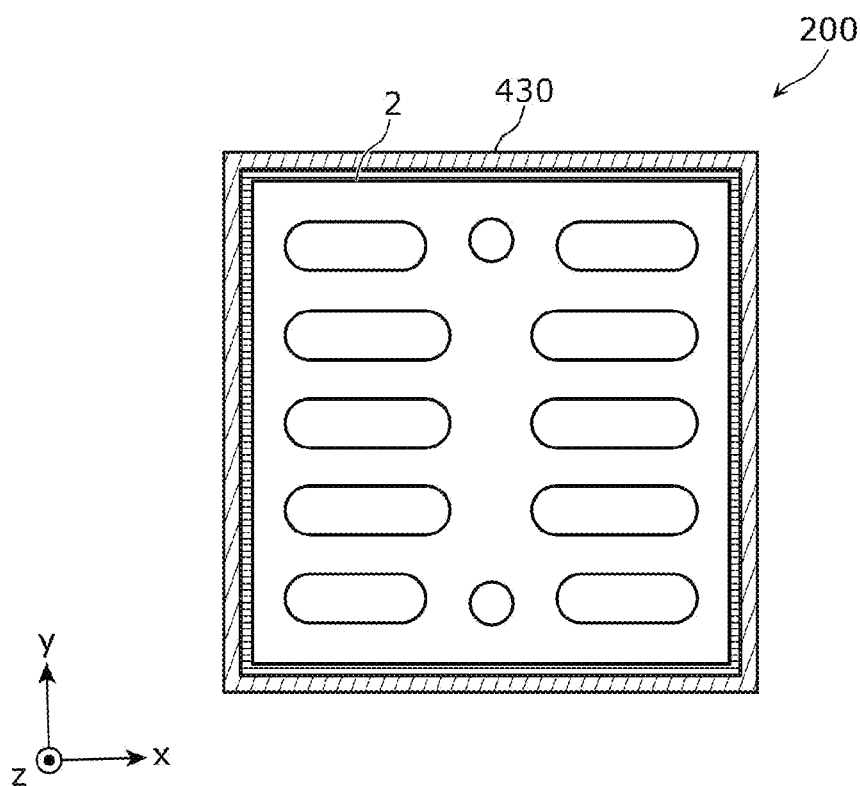
FIG. 11C is a schematic plan view illustrating the example of the structure of the semiconductor device according to Embodiment 3.

FIG. 11A is a schematic cross-sectional view of semiconductor device 200 according to Embodiment 3. FIG. 11B is a schematic plan view of processed support 430 according to Embodiment 3. FIG. 11C is a schematic plan view of semiconductor device 200 after semiconductor chip 2 is mounted on processed support 430. Semiconductor device 200 differs from semiconductor device 1 according to Embodiment 1 in that support 42 is replaced with processed support 430.

When only processed support 430 is seen, as shown in FIG. 11B, a front face of processed support 430 (a face to which semiconductor chip 2 is bonded) is divided into: a first area that includes the center of processed support 430 and does not include the outer periphery of processed support 430 in the plan view; and a second area that surrounds the first area and is a remaining area of the front face of processed support 430. In FIG. 11A and FIG. 11B, a virtual border line between the first area and the second area is indicated by dashed lines.

Although the thickness of processed support 430 is uniform in the first area, a groove-like process is performed on a portion of the front face of processed support 430, and has caused the second area to include a portion where the thickness of processed support 430 is less than the first area. Embodiment 3 shows an example in which the second area includes a portion in which the thickness of processed support 430 is equal to the thickness of processed support 430 in the first area in the vicinity of the outer periphery of processed support 430. However, the thickness of processed support 430 may be uniform in the second area, or processed support 430 may be in a shape that gradually becomes thinner than the thickness of processed support 430 in the first area.

In semiconductor device 200, although semiconductor chip 2 is bonded to the front face side of processed support 430 via conductive adhesive 41, as shown in FIG. 11A and FIG. 11C, the outer periphery of semiconductor layer 40 in semiconductor chip 2 in the plan view is placed to be encompassed within the width of a groove formed in the second area of processed support 430. It should be noted that conductive adhesive 41 that should be seen protruding from semiconductor chip 2 in the plan view is omitted from FIG. 11C.

Accordingly, in semiconductor device 200 according to Embodiment 3, the area of the first area in the front face of processed support 430 is smaller than the area of semiconductor layer 40 in semiconductor chip 2 in the plan view, and semiconductor layer 40 is bonded to processed support 430 in a way that covers the first area in the plan view entirely.

[2. Discussion]

The configuration as described above makes it possible to reduce a length by which conductive adhesive 41 protrudes from semiconductor layer 40 in a horizontal direction in the plan view. Since the groove-like process is performed on the second area of processed support 430, conductive adhesive 41 that has been pushed out flows into the groove. Since it is possible to store conductive adhesive 41 pushed out in the groove to a certain extent, it is possible to reduce a protrusion length in the horizontal direction or a rising height along lateral faces of semiconductor chip 2 by changing the width or depth of the groove appropriately.

Although the semiconductor device according to one aspect of the present disclosure has been thus far described based on each of Embodiments 1 to 3 and Variations 1 to 3, the present disclosure is not limited to these embodiments and variations. Forms obtained by making various modifications conceived by a person skilled in the art to the embodiments or forms obtained by combining constituent elements in different embodiments and variations may be included in in the scope of one or more aspects of the present disclosure, as long as they do not depart from the essences of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device including the vertical MOS transistor according to the present disclosure can be widely used as a device that controls the conducting state of a current pathway.

The invention claimed is:

1. A semiconductor device that is a facedown mountable semiconductor device, the semiconductor device comprising:
   a semiconductor substrate;
   a low-concentration impurity layer that is provided on a front face side of the semiconductor substrate;
   a first vertical metal-oxide semiconductor (MOS) transistor that is provided in a first region of a semiconductor layer that is a combination of the semiconductor substrate and the low-concentration impurity layer;
   a second vertical MOS transistor that is provided in a second region adjacent to the first region in a plan view of the semiconductor layer;
   a first source electrode of the first vertical MOS transistor, the first source electrode being provided on a front face side of the semiconductor layer;
   a second source electrode of the second vertical MOS transistor, the second source electrode being provided on the front face side of the semiconductor layer; and
   a support that is provided on a back face side of the semiconductor substrate via a conductive adhesive,
   wherein in the plan view, the support is larger in area than the semiconductor layer and encompasses the semiconductor layer,
   a thickness of the support is greater than a thickness of the semiconductor layer, and
   when a semiconductor chip of the semiconductor device excluding the support and the conductive adhesive is seen in a cross-sectional view of the semiconductor device that includes a center of the semiconductor layer and an outer periphery of the semiconductor layer in the plan view, the semiconductor chip is in a curved shape that projects in a direction away from the support.

2. The semiconductor device according to claim 1,
   wherein in the plan view, the semiconductor layer is in a square shape, and
   a thickness of the conductive adhesive immediately below the semiconductor layer in the outer periphery of the semiconductor layer in the plan view is less than a thickness of the conductive adhesive immediately below the semiconductor layer at the center of the semiconductor layer in the plan view.

3. The semiconductor device according to claim 2,
   wherein in the plan view, the semiconductor layer has an area of at least 6.2 [$mm^2$], and
   $h \leq 0.016 \times S - 0.042$ is satisfied, where an area and a thickness of the semiconductor layer are denoted by S [$mm^2$] and h [mm], respectively.

4. The semiconductor device according to claim 3,
   wherein in the plan view, the semiconductor layer has an area of at most 11.5 [$mm^2$], and
   $h \leq 0.014 \times S - 0.074$ is satisfied.

5. The semiconductor device according to claim 3, comprising:
   a metal layer that is in contact with an entire back face of the semiconductor substrate,
   wherein $L \geq (h+hp)/\tan(20 \,[\deg])$ is satisfied, where a shortest length of a closest distance from the outer periphery of the semiconductor layer to an outer periphery of the support in the plan view is denoted by L [mm], and a total thickness of the metal layer and the conductive adhesive immediately below the semiconductor layer in a corner portion of the semiconductor layer in the plan view is denoted by hp [mm].

6. The semiconductor device according to claim 3,
   wherein the support includes a metal.

7. The semiconductor device according to claim 3, comprising:
   a metal layer that is in contact with an entire back face of the semiconductor substrate,
   wherein a thickness of the first source electrode is greater than a thickness of the metal layer, and a thickness of the second source electrode is greater than the thickness of the metal layer.

8. The semiconductor device according to claim 3,
wherein the conductive adhesive is directly applied to an entire back face of the semiconductor substrate.

9. The semiconductor device according to claim 1, comprising:
a support metal layer that is located on a front face side of the support and is connected to an area larger in area than the semiconductor substrate in the plan view,
wherein a thickness of the support metal layer is greater than a thickness of the first source electrode, and is greater than a thickness of the second source electrode, and
the support includes an insulating material.

10. The semiconductor device according to claim 3,
wherein in the plan view, a front face side of the support includes: a first area that includes a center of the support and does not include an outer periphery of the support; and a second area that surrounds the first area,
in the cross-sectional view, the first area is uniform in height, and the second area includes a portion in which a height of the second area is less than a height of the first area,
in the plan view, an area of the first area is smaller than an area of the semiconductor substrate, and
in the plan view, the semiconductor substrate is disposed to cover an entirety of the first area of the support.

11. The semiconductor device according to claim 10,
wherein the second area further includes a portion in which a height of the second area is equal to the height of the first area.

12. The semiconductor device according to claim 3,
wherein in the cross-sectional view, the support is in a curved shape that projects in a direction toward the semiconductor chip, and
an amount of curvature of the support is smaller than an amount of curvature of the semiconductor chip.

13. The semiconductor device according to claim 3,
wherein in the cross-sectional view, the support is in a curved shape that projects in a direction away from the semiconductor chip, and
an amount of curvature of the support is smaller than an amount of curvature of the semiconductor chip.

\* \* \* \* \*